(12) United States Patent
Lee et al.

(10) Patent No.: US 12,740,176 B2
(45) Date of Patent: Sep. 15, 2026

(54) IMAGE SENSOR INCLUDING STACKED CHIPS

(71) Applicant: Samsung Electronics Co., Ltd., Suwon-si (KR)

(72) Inventors: Jeongjin Lee, Seoul (KR); Jeongsoon Kang, Gumi-si (KR); Jihong Kim, Seoul (KR); Changyong Um, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 867 days.

(21) Appl. No.: 18/065,531

(22) Filed: Dec. 13, 2022

(65) Prior Publication Data

US 2023/0197756 A1 Jun. 22, 2023

(30) Foreign Application Priority Data

Dec. 22, 2021 (KR) ........................ 10-2021-0185008

(51) Int. Cl.
*H10F 39/00* (2025.01)
*H10F 39/18* (2025.01)

(52) U.S. Cl.
CPC ......... *H10F 39/809* (2025.01); *H10F 39/182* (2025.01); *H10F 39/8053* (2025.01); *H10F 39/807* (2025.01); *H10F 39/811* (2025.01)

(58) Field of Classification Search
CPC .... H10F 39/809; H10F 39/807; H10F 39/182; H10F 39/8053; H10F 39/811
See application file for complete search history.

(56) References Cited

U.S. PATENT DOCUMENTS

| | | | |
|---|---|---|---|
| 7,851,837 | B2 | 12/2010 | Toshikiyo |
| 8,247,256 | B2 | 8/2012 | Ho et al. |
| 8,773,562 | B1 | 7/2014 | Fan |
| 10,365,535 | B2 | 7/2019 | Ahmed et al. |
| 11,121,158 | B2 | 9/2021 | Ammo et al. |
| 2011/0025892 | A1 | 2/2011 | Hibbeler et al. |

(Continued)

FOREIGN PATENT DOCUMENTS

| | | | |
|---|---|---|---|
| KR | 100643681 | B1 | 11/2006 |
| KR | 20090025817 | A | 3/2009 |

(Continued)

OTHER PUBLICATIONS

Extended European Search Report corresponding to European Application No. 22215912.1 (7 pages) (May 9, 2023).

(Continued)

*Primary Examiner* — Brigitte A Paterson
(74) *Attorney, Agent, or Firm* — Wolf, Greenfield & Sacks, P.C.

(57) ABSTRACT

An image sensor includes a first lower chip, and an upper chip on and bonded to the first lower chip. The first lower chip and the upper chip collectively provide a plurality of pixels. A respective pixel of the plurality of pixels includes a photoelectric conversion element, a floating diffusion region, a ground region, and a transfer gate in the upper chip, and a plurality of lower transistors in the first lower chip. A first lower transistor among the plurality of lower transistors includes a plurality of first channel layers stacked vertically, and a first gate on the plurality of first channel layers.

20 Claims, 17 Drawing Sheets

(56) References Cited

U.S. PATENT DOCUMENTS

| | | | | |
|---|---|---|---|---|
| 2017/0345854 | A1 | 11/2017 | Kwon | |
| 2018/0227521 | A1 | 8/2018 | Keung et al. | |
| 2020/0035737 | A1 | 1/2020 | Ito et al. | |
| 2021/0104571 | A1 | 4/2021 | Shohji et al. | |
| 2021/0193715 | A1 | 6/2021 | Mccarten | |
| 2021/0242270 | A1 | 8/2021 | Im et al. | |
| 2021/0351079 | A1 | 11/2021 | Su et al. | |
| 2021/0375973 | A1 | 12/2021 | Ha et al. | |
| 2022/0359620 | A1 | 11/2022 | Nishio et al. | |
| 2023/0378219 | A1* | 11/2023 | Yokoyama | H10F 39/018 |
| 2023/0411429 | A1* | 12/2023 | Nakazawa | H10F 39/18 |

FOREIGN PATENT DOCUMENTS

| | | | |
|---|---|---|---|
| KR | 10-2017-0135309 | A | 12/2017 |
| KR | 10-2019-0131489 | A | 11/2019 |
| KR | 10-2021-0137372 | A | 11/2021 |
| KR | 10-2021-0148541 | A | 12/2021 |
| WO | 2018189994 | A1 | 10/2018 |
| WO | 2020262132 | A1 | 12/2020 |

OTHER PUBLICATIONS

Ziaei-Moayyed et al., Gate-All-Arround Single-Crystalline Silicon Nanowjre Optical Sensor. IEEE 16th International Solid-State Sensors, Actuators and Microsystems Conference, Jun. 5-9, 2011;T4C. 007:1757-60.

* cited by examiner

IMAGE SENSOR INCLUDING STACKED CHIPS

CROSS-REFERENCE TO RELATED APPLICATION(S)

This application claims the benefit under 35 USC 119(a) of Korean Patent Application No. 10-2021-0185008 filed on Dec. 22, 2021, in the Korean Intellectual Property Office, the entire disclosure of which is incorporated herein by reference for all purposes.

FIELD

The present inventive concept relates to an image sensor comprising stacked chips.

BACKGROUND

Image sensors are semiconductor-based sensors that are configured to receive light and generate electrical signals, and may include pixel arrays having a plurality of pixels, logic circuits for driving the pixel arrays and generating images, and the like. Each of the pixels may include a photodiode and a pixel circuit that is configured to convert electrical charges generated by the photodiode into electric signals.

SUMMARY

Example embodiments provide an image sensor in which integration may increase and performance may be improved by disposing a pixel circuit on a lower chip and an upper chip.

According to example embodiments, an image sensor includes a first lower chip; and an upper chip on and bonded to the first lower chip. The first lower chip and the upper chip share or collectively comprise a plurality of pixels. A respective pixel of the plurality of pixels includes a photoelectric conversion element, a floating diffusion region, a ground region, and a transfer gate in the upper chip; and a plurality of lower transistors in the first lower chip. A first lower transistor among the plurality of lower transistors includes a plurality of first channel layers stacked vertically, and a first gate on the plurality of first channel layers.

According to example embodiments, an image sensor includes a first lower chip; an upper chip on and bonded to the first lower chip; and a second lower chip bonded to the first lower chip, below the first lower chip. The first lower chip and the upper chip collectively comprise a pixel array including a plurality of pixels. The second lower chip includes a control circuit configured to control the pixel array, a respective pixel of the plurality of pixels includes a photoelectric conversion element, a floating diffusion region, a ground region, a transfer gate, a reset transistor, a selection transistor, and a driving transistor, the upper chip includes the photoelectric conversion element, the floating diffusion region, the ground region, and the transfer gate, the first lower chip includes at least one transistor among the reset transistor, the selection transistor, or the driving transistor, and the at least one transistor of the first lower chip has a first three-dimensional transistor structure including a plurality of first channel layers stacked vertically, and a first gate on the plurality of first channel layers.

According to example embodiments, an image sensor includes a first lower chip; an upper chip on and bonded to the first lower chip; and a second lower chip bonded to the first lower chip, below the first lower chip. The first lower chip and the upper chip collectively comprise a pixel array including a plurality of pixels. The second lower chip includes a control circuit configured to control the pixel array. A respective pixel of the plurality of pixels includes a photoelectric conversion element, a floating diffusion region, a ground region, a transfer gate, a reset transistor, a selection transistor, and a driving transistor. The upper chip includes the photoelectric conversion element, the floating diffusion region, the ground region, and the transfer gate. The first lower chip includes at least one transistor among the reset transistor, the selection transistor, or the driving transistor. The upper chip further includes an upper semiconductor substrate having a first surface and a second surface opposing each other; color filters on the second surface of the upper semiconductor substrate; pixel isolation structures in the upper semiconductor substrate; an upper insulating structure below the first surface of the upper semiconductor substrate; and upper bonding pads in the upper insulating structure and having lower surfaces coplanar with a lower surface of the upper insulating structure. The photoelectric conversion element is in the upper semiconductor substrate, between the pixel isolation structures. The floating diffusion region and the ground region are in the upper semiconductor substrate adjacent to the first surface of the upper semiconductor substrate. The first lower chip further includes a first lower semiconductor substrate; a first lower insulating structure on the first lower semiconductor substrate; first lower bonding pads in the first lower insulating structure and having upper surfaces coplanar with an upper surface of the first lower insulating structure; and a lower protective insulating layer below the first lower semiconductor substrate. The second lower chip further includes a second lower semiconductor substrate; and a second lower insulating structure on the second lower semiconductor substrate. The first lower bonding pads and the upper bonding pads are in contact with each other. The at least one transistor of the first lower chip has a first three-dimensional transistor structure including a plurality of first channel layers, vertically stacked, and a first gate on the plurality of first channel layers.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
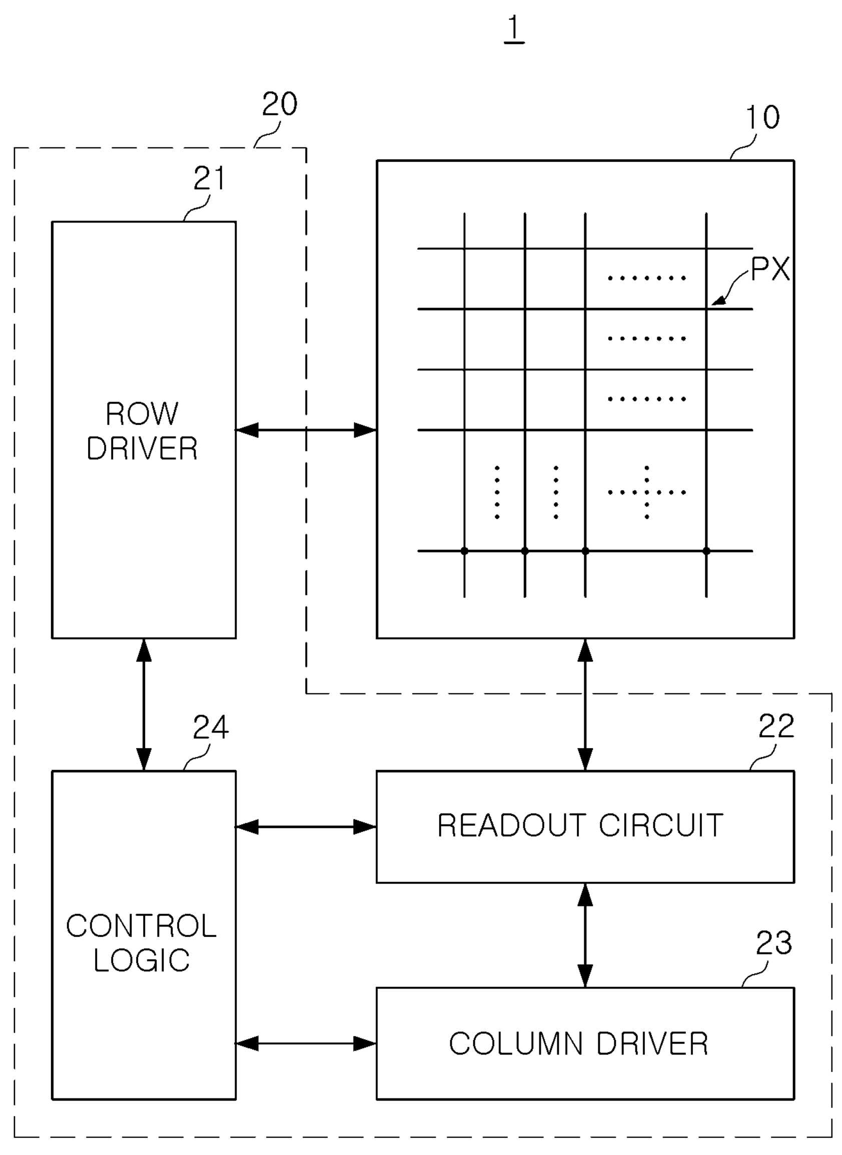
FIG. 1 is a schematic block diagram of an image sensor according to an example embodiment.

Hereinafter, relative terms such as 'on', 'upper portion', 'upper surface', 'below', 'lower portion', 'lower surface', 'side', 'upper end', 'bottom', and the like may be understood as referring to example embodiments as shown in the drawings, except cases in which they are denoted by reference numerals and are referred to separately. The terms first, second, third, etc., may be used herein merely to distinguish one element from another.

An image sensor according to an example embodiment will be described with reference to FIG. 1. FIG. 1 is a block diagram schematically illustrating an image sensor according to an example embodiment.

Referring to FIG. 1, an image sensor 1 may include a pixel array 10 and a logic circuit 20.

The pixel array 10 may include a plurality of pixels PX disposed in an array form in a plurality of rows and a plurality of columns. Each of the plurality of pixels PX may include at least one photoelectric conversion element that generates charge in response to light, a pixel circuit that generates a pixel signal corresponding to the charge generated by the photoelectric conversion element, and the like. The photoelectric conversion element may include a photodiode formed of a semiconductor material, and/or an organic photodiode formed of an organic material. For example, the pixel circuit may include a floating diffusion region, a transfer transistor, a reset transistor, a driving transistor, a selection transistor, and the like.

The configuration of the pixels PX may vary depending on example embodiments. In an example, each of the pixels PX may include an organic photodiode including an organic material, or may be implemented as a digital pixel. When the pixels PX are implemented as digital pixels, each of the pixels PX may include an analog-to-digital converter for outputting a digital pixel signal.

The logic circuit 20 may include circuits for controlling the pixel array 10. In an example, the logic circuit 20 may include a row driver 21, a readout circuit 22, a column driver 23, a control logic 24, and the like. The row driver 21 may drive the pixel array 10 in units of row lines. For example, the row driver 21 may generate a transfer control signal for controlling the transfer transistor of the pixel circuit, a reset control signal for controlling the reset transistor, and a selection control signal for controlling the selection transistor, and may provide the generated signals to the pixel array 10 in the row line unit.

The readout circuit 22 may include a correlated double sampler (CDS), an analog-to-digital converter (ADC), and the like. The correlated double samplers may be connected to the pixels PX through column lines. The correlated double samplers may read a pixel signal through column lines from the pixels PX connected to a row line selected by a row line selection signal of the row driver 21. The analog-to-digital converter may convert the pixel signal detected by the correlated double sampler into a digital pixel signal and transmit the converted signal to the column driver 23.

The column driver 23 may include a latch or buffer circuit capable of temporarily storing a digital pixel signal, an amplifier circuit, and the like, and may process a digital pixel signal received from the readout circuit 22.

The row driver 21, the readout circuit 22, and the column driver 23 may be controlled by the control logic 24. The control logic 24 may include a timing controller for controlling operation timings of the row driver 21, the readout circuit 22, and the column driver 23.

Among the pixels PX, pixels PX disposed at the same position in the horizontal direction may share the same column line. For example, the pixels PX disposed at the same position in the vertical direction may be simultaneously selected by the row driver 21 and may output pixel signals through column lines.

In an example embodiment, the readout circuit 22 may simultaneously acquire pixel signals from the pixels PX selected by the row driver 21 through column lines. The pixel signal may include a reset voltage and a pixel voltage, and the pixel voltage may be a voltage in which charges generated in response to light in each of the pixels PX are reflected in the reset voltage.

Figure 2:
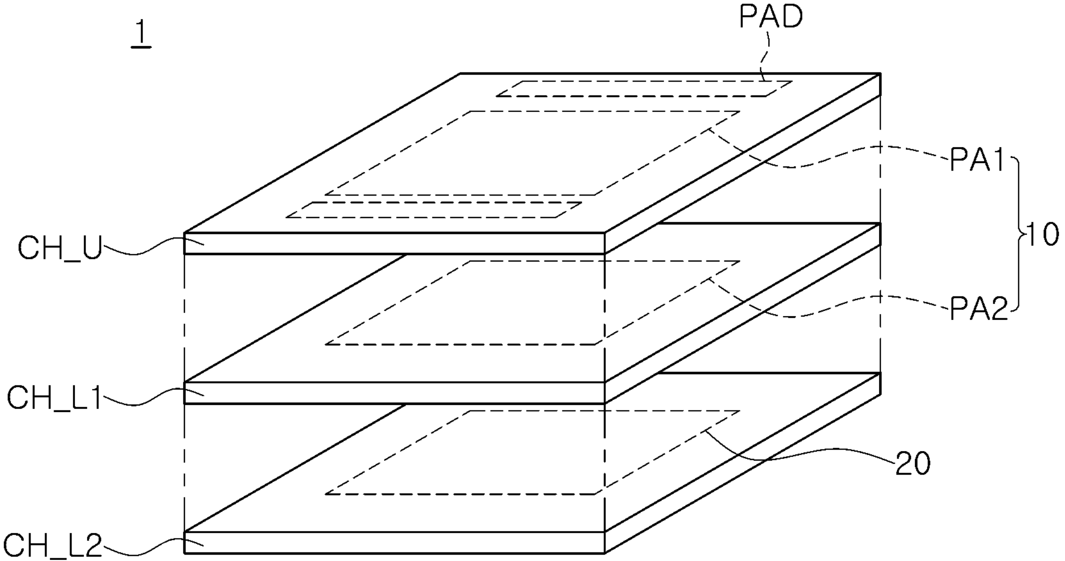
FIG. 2 is a perspective view schematically illustrating an image sensor according to an example embodiment.

An example of the image sensor 1 according to an example embodiment will be described with reference to FIG. 2 together with FIG. 1. FIG. 2 is a perspective view schematically illustrating an image sensor 1 according to an example embodiment.

Referring to FIGS. 1 and 2, the image sensor 1 may include a plurality of chips sequentially stacked. For example, the plurality of chips may include an upper chip CH_U, a first lower chip CH_L1 below the upper chip CH_U, and a second lower chip CH_L2 below the first lower chip CH_L1.

The first lower chip CH_L1 and the upper chip CH_U may include the pixel array 10 (e.g., collectively), and the second lower chip CH_L2 may include the logic circuit 20.

Accordingly, the elements of the respective pixels (PX in FIG. 1) constituting the pixel array 10 may be classified and disposed in the first lower chip CH_L1 and the upper chip CH_U. For example, the upper chip CH_U may include a first pixel area PA1, and the first lower chip CH_L1 may include a second pixel area PA2 that vertically overlaps the first pixel area PA1 (e.g., overlapping in the Z-direction in which the chips CH_U, CH_L1, etc. are vertically stacked).

The upper chip CH_U may further include a pad area PAD disposed on at least one side of the pixel array 10.

Figure 3A:
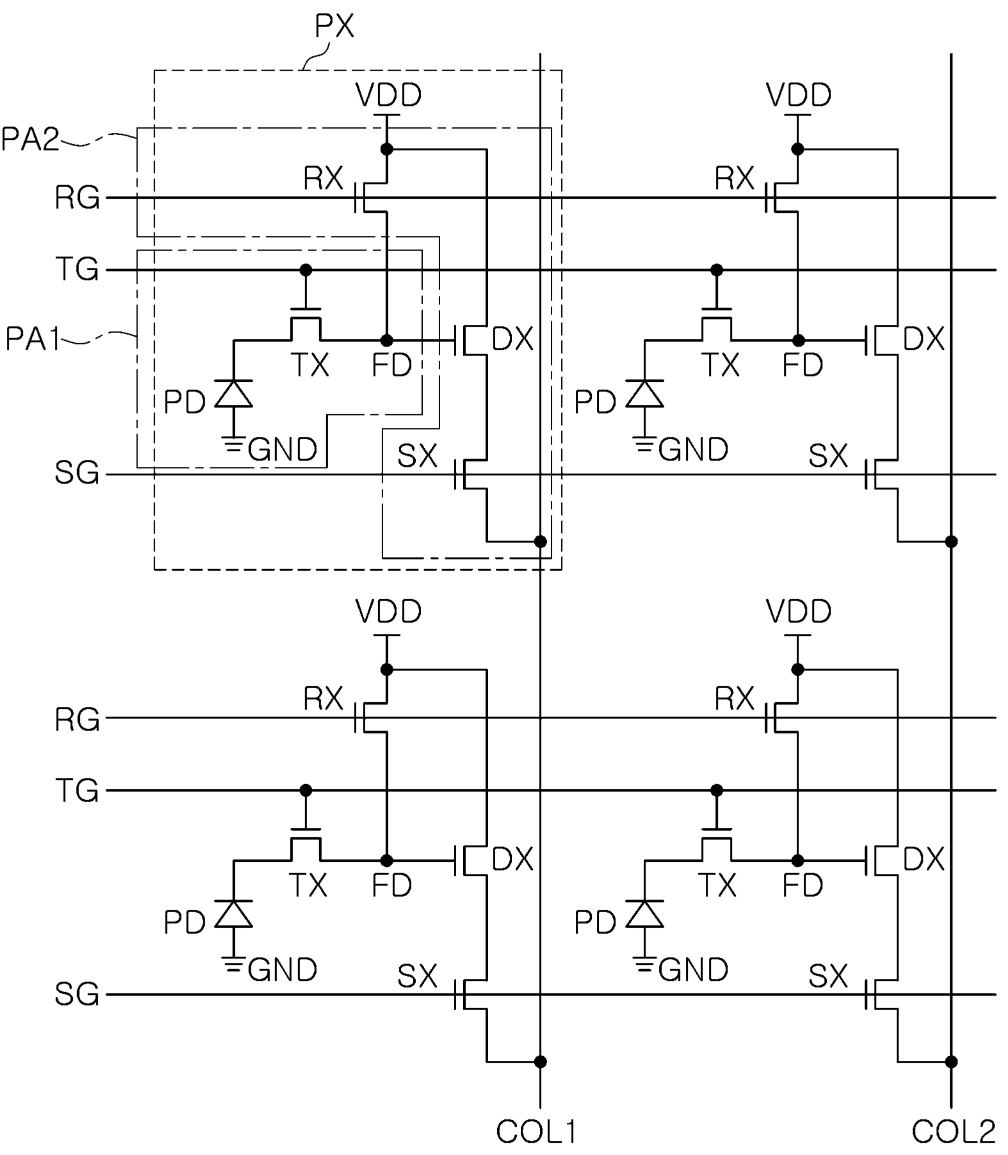
FIG. 3A is a diagram schematically illustrating an example of a pixel circuit of an image sensor according to an example embodiment.

Next, an example of a pixel circuit of the image sensor 1 according to an example embodiment will be described with reference to FIG. 3A together with FIGS. 1 and 2. FIG. 3A is a diagram schematically illustrating an example of a pixel circuit of an image sensor according to an example embodiment.

Referring to FIG. 3A together with FIGS. 1 and 2, each of the plurality of pixels (PX in FIG. 1) may include a photoelectric conversion element PD and a pixel circuit, and the pixel circuit includes a transfer transistor TX, a reset transistor RX, a selection transistor SX, a driving transistor DX, and the like. In addition, the pixel circuit may further include a floating diffusion region FD in which charges generated by the photoelectric conversion element PD are accumulated.

Hereinafter, the photoelectric conversion element PD will be referred to as a photodiode as an example of the photoelectric conversion element PD and described.

The photodiode PD may generate and accumulate electrical charges in response to externally incident light. The photodiode PD may be replaced with a phototransistor, a photogate, a pinned photodiode, or the like according to example embodiments.

The transfer transistor TX may be turned on or turned off by a transfer control signal input to the transfer gate TG. The transfer transistor TX may move the charge generated by the photodiode PD to the floating diffusion region FD. The floating diffusion region FD may store charges generated by the photodiode PD. A voltage output from the driving transistor DX may vary according to the amount of charge accumulated in the floating diffusion region FD.

The reset transistor RX may reset the voltage of the floating diffusion region FD by removing charges accumulated in the floating diffusion region FD. A drain electrode of the reset transistor RX may be connected to the floating diffusion region FD, and a source electrode of the reset transistor RX may be connected to a power supply voltage VDD. When the reset transistor RX is turned on, the power supply voltage VDD connected to the source electrode of the reset transistor RX is applied to the floating diffusion region FD, and the reset transistor RX may remove charges accumulated in the floating diffusion region FD.

The driving transistor DX may operate as a source follower buffer amplifier. The driving transistor DX may amplify a voltage change in the floating diffusion region FD and output the same to one of the column lines COL1 and COL2. The selection transistor SX may select the pixels PX to be read in row units. When the selection transistor SX is turned on, the voltage of the driving transistor DX may be output to one of the column lines COL1 and COL2. For example, when the selection transistor SX is turned on, a reset voltage or a pixel voltage may be output through the column lines COL1 and COL2.

Each of the plurality of pixels PX may further include a ground region GND to which a ground voltage may be input. Accordingly, each of the plurality of pixels PX may include the ground region GND, the photodiode PD, the transfer transistor TX, the reset transistor RX, the selection transistor SX, and the driving transistor DX.

Figure 10:
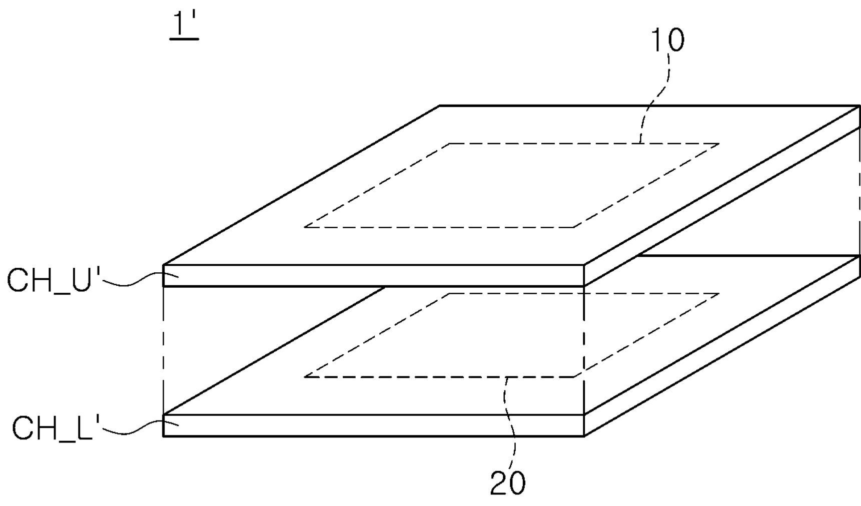
FIG. 10 is a perspective view schematically illustrating a modified example of an image sensor according to an example embodiment.

In each of the plurality of pixels PX, the ground region GND, the photodiode PD, and the transfer transistor TX including the transfer gate TG may be disposed in the first pixel area PA1 of the upper chip (CH_U) in FIG. 2, and the reset transistor RX, the selection transistor SX, and the driving transistor DX may be disposed in the second pixel area PA2 of the first lower chip CH_L1 in FIG. 2 or in the upper chip CH_U' in FIG. 10.

Figure 3B:
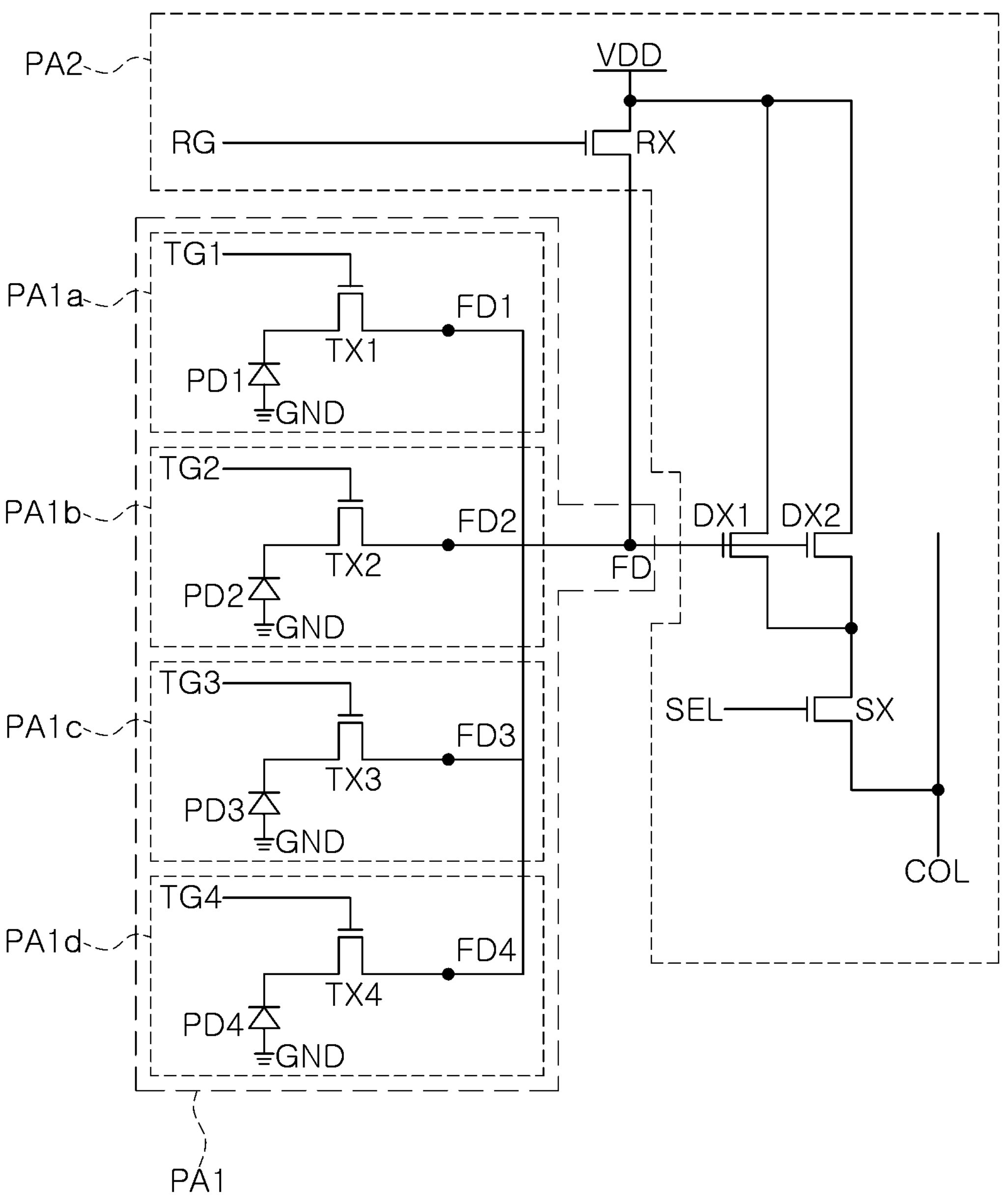
FIG. 3B is a diagram schematically illustrating another example of a pixel circuit of an image sensor according to an example embodiment.

Next, another example of the pixel circuit of the image sensor 1 according to an example embodiment will be described with reference to FIG. 3B. FIG. 3B is a diagram schematically illustrating another example of a pixel circuit of an image sensor according to an example embodiment.

Referring to FIG. 3B together with FIGS. 1 and 2, two or more pixels adjacent to each other may share at least a portion of transistors included in the pixel circuit. For example, four pixels adjacent to each other may share the reset transistor RX, the driving transistors DX1 and DX2, and the selection transistor SX.

Four adjacent pixels may include photodiodes PD1-PD4, a ground region GND, transfer transistors TX1-TX4 having transfer gates TG1-TG4, and floating diffusion regions FD1-FD4, respectively.

In an example, a first area PA1$a$ in which a first pixel of the four pixels is disposed may include a ground region GND, a first photodiode PD1, a first floating diffusion region FD1, and a first transfer transistor TX1 having a first transmission gate TG1. In the first area PA1$a$, the first photodiode PD1 may be connected to the first floating diffusion region FD1 through the first transfer transistor TX1. Similarly, in second to fourth areas PA1$b$-PA1$d$ in which second to fourth pixels among the four pixels are disposed, second to fourth photodiodes PD2-PD4 may be connected to the second to fourth floating diffusion regions FD2-FD4 through the second to fourth transfer transistors TX2-TX4 including the second to fourth transfer gates TG2-TG4, respectively.

In the four adjacent pixels, the first to fourth floating diffusion regions FD1 to FD4 may be connected to each other by an interconnection structure and/or the like to operate as one floating diffusion region FD. The first to fourth transfer transistors TX1 to TX4 may be commonly connected to the one floating diffusion region FD in which the first to fourth floating diffusion regions FD1 to FD4 are connected to each other.

The pixel circuit may include the reset transistor RX, the first and second driving transistors DX1 and DX2, and the selection transistor SX. The reset transistor RX may be controlled by a reset control signal RG, and the selection transistor SX may be controlled by a selection control signal SEL. For example, each of the four pixels PX may further include one transistor in addition to the transfer transistor TX. Two of the four transistors included in the four pixels are connected in parallel to provide the first and second driving transistors DX1 and DX2, and one of the remaining two transistors may be provided as the selection transistor SX, and the other one may be configured to be provided as the reset transistor RX.

The pixel circuit described with reference to FIG. 3B is only an example embodiment, and is not necessarily limited to the illustrated arrangement. For example, one of the four transistors may be allocated as a driving transistor and one may be allocated as a selection transistor. In addition, by connecting the remaining two transistors to each other in series and allocating the two transistors as first and second reset transistors, an image sensor capable of adjusting a conversion gain of a pixel may be implemented. Alternatively, the pixel circuit may vary according to the number of transistors included in each of the pixels PX.

Figure 4:
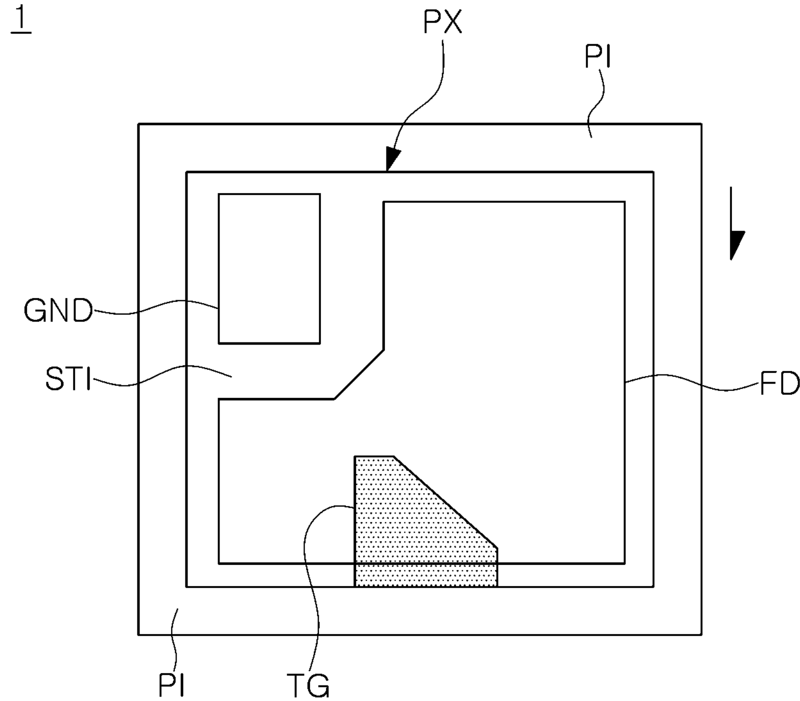
FIG. 4 is a top plan view schematically illustrating an example of an image sensor according to an example embodiment.

Next, one pixel PX in the first pixel area PA1 of the upper chip CH_U will be described with reference to FIG. 4 along with FIGS. 1, 2, and 3A. FIG. 4 is a top view schematically illustrating one pixel PX in the first pixel area PA1 of the upper chip CH_U.

Referring to FIG. 4 together with FIGS. 1, 2 and 3A, the image sensor 1 may further include a pixel isolation region PI surrounding the one pixel PX in top view. The pixel PX may include a floating diffusion region FD, a ground region GND, and a transfer gate TG.

The image sensor 1 may further include a device isolation region STI between the floating diffusion region FD and the ground region GND.

The image sensor 1 may further include a floating diffusion contact FD_C electrically connected to the floating diffusion region FD, a ground contact GND_C for grounding the ground region GND, and a transfer gate contact TG_C (see FIG. 5) electrically connected to the transfer gate TG.

Figure 5:
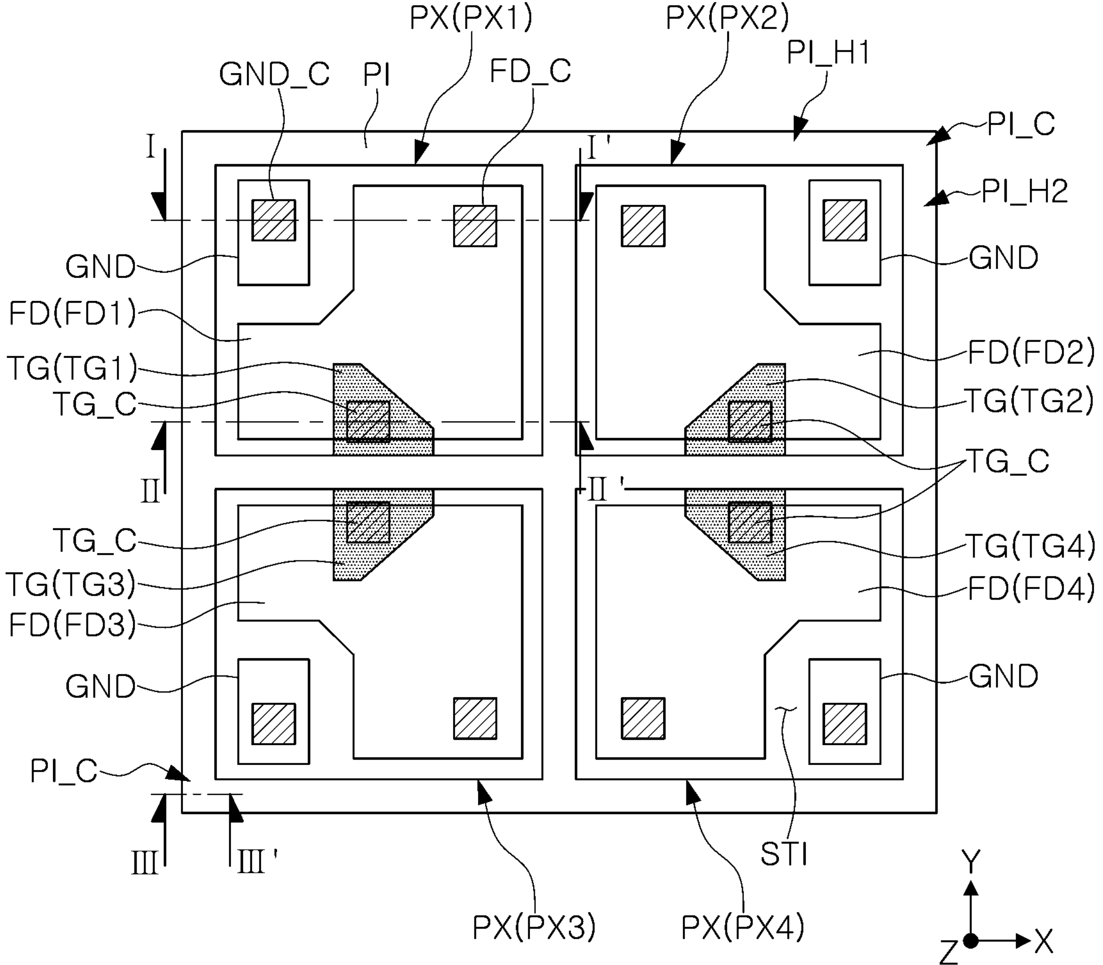
FIGS. 5, 6, 7, 8, and 9 are diagrams schematically illustrating an example of an image sensor according to an example embodiment.
Figure 6:
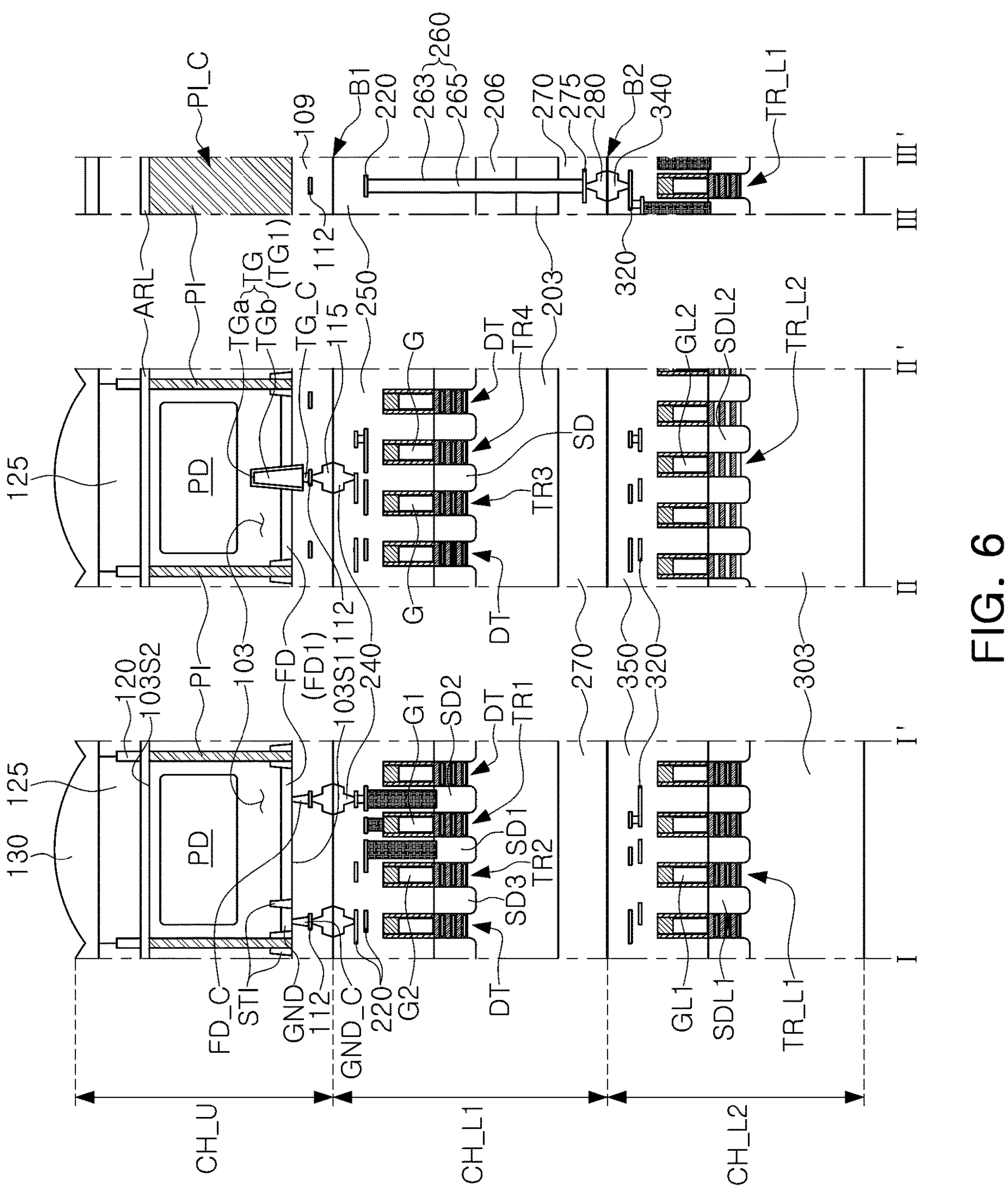

Next, referring to FIGS. 5 and 6 along with FIGS. 1, 2, and 3B, a plurality of pixels PX disposed in the first pixel area PA1 of the upper chip CH_U are illustrated. FIG. 5 is a schematic top view of a plurality of pixels PX disposed in the first pixel area PA1 of the upper chip CH_U, and FIG. 6 is a cross-sectional view illustrating regions taken along line I-I', line II-II' and line III-III' of FIG. 5.

Referring to FIGS. 5 and 6 together with FIGS. 1, 2, and 3B, in the image sensor 1, the upper chip CH_U, in a top plan view, may further include a pixel isolation region PI respectively surrounding a plurality of pixels PX. Each of the plurality of pixels PX may include the floating diffusion region FD, the ground region GND, and the transfer gate TG.

The upper chip CH_U may further include an upper semiconductor substrate 103 having a first surface 103S1 and a second surface 103S2 opposing each other. The upper semiconductor substrate 103 may be a single crystal silicon substrate, but the example embodiment is not limited thereto. For example, the upper semiconductor substrate 103 may be a semiconductor substrate including a compound semiconductor material.

The photodiodes PD may be disposed in the upper semiconductor substrate 103.

The pixel isolation region PI may be disposed in the upper semiconductor substrate 103 and may be disposed between the photodiodes PD. The pixel isolation region PI may be disposed in a grid shape.

In an example, the plurality of pixels PX may include the first to fourth pixels PX1 to PX4 described with reference to FIG. 3B. For example, as described with reference to FIG. 3B, the first pixel PX1 may include the ground region GND, the first photodiode PD1, the first floating diffusion region FD1, and the first transfer gate TG1, the second pixel PX2 may include the ground region GND, the second photodiode PD2, the second floating diffusion region FD2 and the second transfer gate TG2, the third pixel PX3 may include the ground region GND, the third photodiode PD3, the third floating diffusion region FD3 and the third transfer gate TG3, and the fourth pixel PX4 may include the ground region GND, the fourth photodiode PD4, the fourth floating diffusion region FD4, and the fourth transfer gate TG4.

The upper chip CH_U may include the ground regions GND, the first to fourth photodiodes PD1-PD4, the first to fourth floating diffusion regions FD1-FD4, and the first to fourth transfer gates TG1-TG4. The ground region GND, the photodiode PD, and the floating diffusion region FD may be disposed in the upper semiconductor substrate 103. The ground regions GND and the floating diffusion regions FD are adjacent to the first surface 103S1 of the upper semiconductor substrate 103 and may be disposed within the semiconductor substrate 103 positioned below the photodiodes PD.

Each of the transfer gates TG may include a transfer gate electrode TGb and a gate dielectric TGa between the transfer gate electrode TGb and the upper semiconductor substrate 103.

Each of the transfer gates TG may extend from the first surface 103S1 of the upper semiconductor substrate 103 in a direction from the first surface 103S1 to the second surface 103S2. The transfer gates TG may include at least a portion disposed in a region recessed in a direction from the first surface 103S1 to the second surface 103S2 of the semiconductor substrate 103.

The upper chip CH_U may further include a device isolation region STI disposed on the first surface 103S1 of the upper semiconductor substrate 103. The device isolation region STI may be formed by shallow trench isolation. For example, the device isolation region STI may be formed of an insulating material such as silicon oxide filling a trench.

The device isolation region STI may be disposed to respectively surround the ground regions GND and the floating diffusion regions FD.

The upper chip CH_U may further include an insulating structure ARL disposed on the second surface 103S2 of the upper semiconductor substrate 103, color filters 125 disposed on the insulating structure ARL, a grid structure 120 disposed between the color filters 125, on the insulating structure ARL, and microlenses 130 disposed on the color filters 125.

The insulating structure ARL may include an anti-reflection layer capable of reducing or preventing reflection of light that may be caused by a sudden change in refractive index on the second surface 103S2 of the upper semiconductor substrate 103, which may be formed of silicon. The microlenses 130 may condense or concentrate incident light into or onto the photodiodes PD.

The upper chip CH_U may further include an upper insulating structure 109 disposed below the first surface 103S1 of the upper semiconductor substrate 103.

The image sensor 1 may further include floating diffusion contacts FD_C electrically connected to the floating diffusion regions FD, ground contacts GND_C for grounding the ground regions GND, and transfer gate contacts TG_C electrically connected to the transfer gate TG. The floating diffusion contacts FD_C, the ground contacts GND_C, and the transfer gate contacts TG_C may be disposed in the upper insulating structure 109 and may be formed of a conductive material.

The image sensor 1 may further include upper bonding pads 115 buried in the upper insulating structure 109 and having lower surfaces coplanar with the lower surface of the upper insulating structure 109, and an upper interconnection structure 112 disposed in the upper insulating structure 109 and electrically connecting the upper bonding pads 115 and the contacts FD_C, GND_C, and TG_C. The upper bonding pads 115 may include a metal material such as copper.

The first lower chip CH_L1 may include a first lower semiconductor substrate 203, a plurality of transistors TR1, TR2, TR3 and TR4 disposed on the first lower semiconductor substrate 203, a first lower insulating structure 250 covering the plurality of transistors TR1, TR2, TR3, and TR4 on the first lower semiconductor substrate 203, first lower bonding pads 240 buried in the first lower insulating structure 250 and having upper surfaces coplanar with the upper surface of the first lower insulating structure 250, and a first lower interconnection structure 220 disposed in the first lower insulating structure 250 and electrically connecting the first lower bonding pads 240 and the plurality of transistors TR1, TR2, TR3, and TR4.

In an example, the plurality of transistors TR1, TR2, TR3, and TR4 may constitute the reset transistor RX, the driving transistors DX1 and DX2 and the selection transistor SX described with reference to FIG. 3B. As illustrated in FIG. 3B, since the number of transistors included in each of the pixels PX may increase, the number of the plurality of transistors TR1, TR2, TR3, and TR4 may increase.

In an example, at least one of the plurality of transistors TR1, TR2, TR3, and TR4 may constitute the reset transistor RX. For example, when the first transistor TR1 among the plurality of transistors TR1, TR2, TR3, and TR4 is the reset transistor RX, the first transistor TR1 may include a first source/drain SD1, a second source/drain SD2, and a gate G1, and the second source/drain SD2 may be electrically connected to the floating diffusion region FD through the first lower interconnection structure 220, the first lower bonding pad 240, the upper bonding pad 115, the upper interconnection structure 112 and the floating diffusion contact FD_C. The second source/drain SD2 may be electrically connected to the floating diffusion region FD and may vertically overlap the floating diffusion region FD.

The first lower bonding pad 240 and the upper bonding pad 115 bonded to each other may be disposed between the second source/drain SD2 and the floating diffusion region FD. The first lower bonding pad 240 and the upper bonding pad 115 bonded to each other may vertically overlap the floating diffusion region FD. Accordingly, since the signal transmission path between the second source/drain SD2 and the floating diffusion region FD may be significantly reduced, the performance of the image sensor 1 may be improved.

In an example, a pair of adjacent transistors among the plurality of transistors TR1, TR2, TR3, and TR4 may share one source/drain region. For example, a pair of first and second transistors TR1 and TR2 among the plurality of transistors TR1, TR2, TR3, and TR4 may share one source/drain SD1. Accordingly, the first transistor TR1 may include a gate G1, a shared source/drain SD1 on one side of the gate G1, and a source/drain SD2 on the other side of the gate G1. The second transistor TR2 may include a gate G2, a shared source/drain SD1 on one side of the gate G2, and a source/drain SD3 on the other side of the gate G2.

In another example, the first and second transistors TR1 and TR2 do not share one source/drain SD1 and may include a source/drain, respectively.

Each of the third and fourth transistors TR3 and TR4 may include gates G and source/drains S/D.

In an example embodiment, a dummy structure DT may be disposed on at least one side of each of the plurality of transistors TR1, TR2, TR3, and TR4. The dummy structure DT may be disposed next to a source/drain to be electrically isolated from other adjacent components among the plurality of transistors TR1, TR2, TR3, and TR4. The dummy structure DT may be any one of a trench isolation layer, a dummy structure including a dummy gate, and a dummy isolation structure.

In an example, to significantly reduce a signal transmission path to improve the performance of the image sensor 1, the second source/drain SD2, the first lower interconnection structure 220, the first lower bonding pad 240, the upper bonding pad 115, the upper interconnection structure 112, the floating diffusion contact FD_C, and the floating diffusion region FD may be vertically aligned.

The first lower bonding pads 240 may include the same material as the upper bonding pads 115, for example, a copper material. The first lower bonding pads 240 may be bonded to while contacting with the upper bonding pads 115. The upper surface of the first lower insulating structure 250 and the lower surface of the upper insulating structure 109 may be bonded while being in contact with each other. Elements that are described as "in contact" or "in contact with" other elements may refer to physical contact, for example, direct contact with no intervening elements therebetween. Accordingly, a bonding interface or surface B1 between the upper chip CH_U and the first lower chip CH_L1 may be the bonding surfaces between the first lower bonding pads 240 and the upper bonding pads 115 and may be a bonding surface of the first lower insulating structure 250 and the upper insulating structure 109.

The first lower chip CH_L1 may further include a device isolation region 206 in the first lower semiconductor substrate 203, a lower protective insulating layer 270 below the first lower semiconductor substrate 203, a second lower bonding pad 280 having a lower surface coplanar with a lower surface of the lower protective insulating layer 270 in the lower protective insulating layer 270, a lower redistribution 275 disposed in the lower protective insulating layer 270 and in contact with the second lower bonding pad 280, and a through-electrode structure 260 passing through the first lower semiconductor substrate 203 and the device isolation region 206 and electrically connecting the first lower interconnection structure 220 and the lower redistribution 275 to each other.

The through electrode structure 260 may include a through electrode 265 that may be formed of a conductive material, and an insulating spacer 263 that may be formed of an insulating material and surround a side surface of the through electrode 265.

The through electrode structure 260 may vertically overlap the pixel isolation region PI. The through electrode structure 260 may vertically overlap an intersection region PI_C of the pixel isolation region PI. For example, in the top view, the pixel isolation region PI may include first line portions PI_H1 extending in a first direction X, second line portions PI_H2 extending in a second direction Y perpendicular to the first direction X, and intersection regions PI_C in which the first line portions PI_H1 and the second line portions PI_H2 intersect. Accordingly, the through electrode structure 260 may overlap the intersection region PI_C of the pixel isolation region PI in the vertical direction Z.

The second lower chip CH_L2 may include a second lower semiconductor substrate 303, a plurality of lower transistors TR_L1 and TR_L2 disposed on the second lower semiconductor substrate 303, a second lower insulating structure 350 covering the plurality of lower transistors TR_L1 and TR_L2 on the second lower semiconductor substrate 303, third lower bonding pads 340 buried in the second lower insulating structure 350 and having upper surfaces coplanar with the upper surface of the second lower insulating structure 350, and a second lower interconnection structure 320 disposed in the second lower insulating structure 350 and electrically connecting the third lower bonding pads 340 and the plurality of lower transistors TR_L1 and TR_L2.

The third lower bonding pads 340 may include the same material as the second lower bonding pads 280, for example, a copper material. The third lower bonding pads 340 may be bonded while contacting the second lower bonding pads 280. The upper surface of the second lower insulating structure 350 and the lower surface of the lower protective insulating layer 270 may be bonded while contacting each other. Accordingly, a bonding interface or surface B2 between the second lower chip CH_L2 and the first lower chip CH_L1 may be bonding surfaces between the third lower bonding pads 340 and the second lower bonding pads 280 and may be a bonding surface between the second lower insulating structure 350 and the lower protective insulating layer 270.

The plurality of lower transistors TR_L1 and TR_L2 may include a first lower transistor TR_L1 including a gate GL1 and a source/drain SDL1, and a second lower transistor TR_L2 including a gate GL2 and a source/drain SDL2.

The plurality of lower transistors TR_L1 and TR_L2 may be transistors constituting the logic circuit 20 described with reference to FIG. 1.

The plurality of transistors TR1, TR2, TR3, and TR4 and the plurality of lower transistors TR_L1 and TR_L2 may be formed as a three-dimensional (3D) transistor including a 3D channel.

The plurality of transistors TR1, TR2, TR3 and TR4 and the plurality of lower transistors TR_L1 and TR_L2 may be comprised of a first three-dimensional transistor (TR_A in FIGS. 7-9) including a first channel structure, and a second three-dimensional transistor (TR_B in FIGS. 7-9) including a second channel structure different from the first channel structure.

Figure 7:
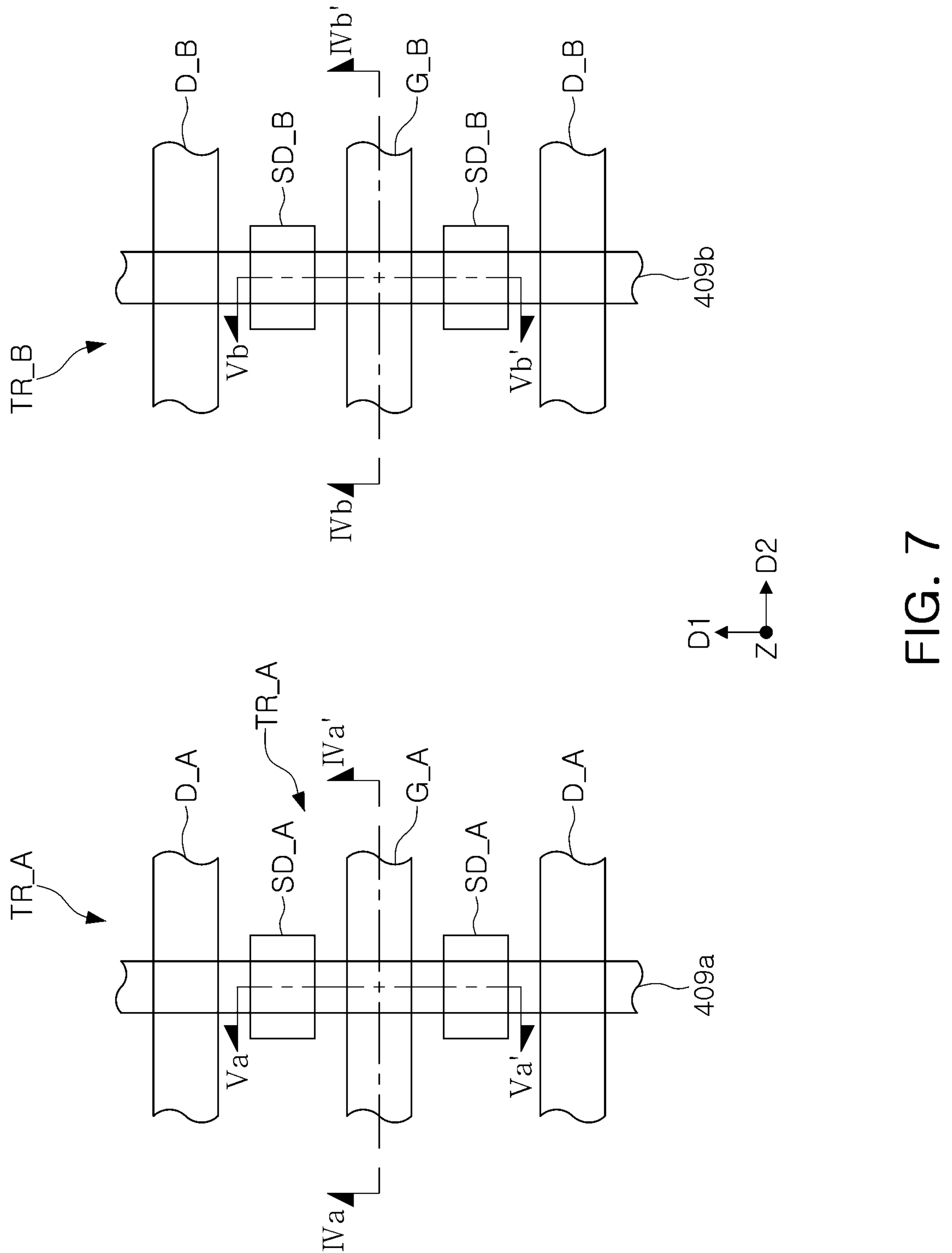
Figure 8:
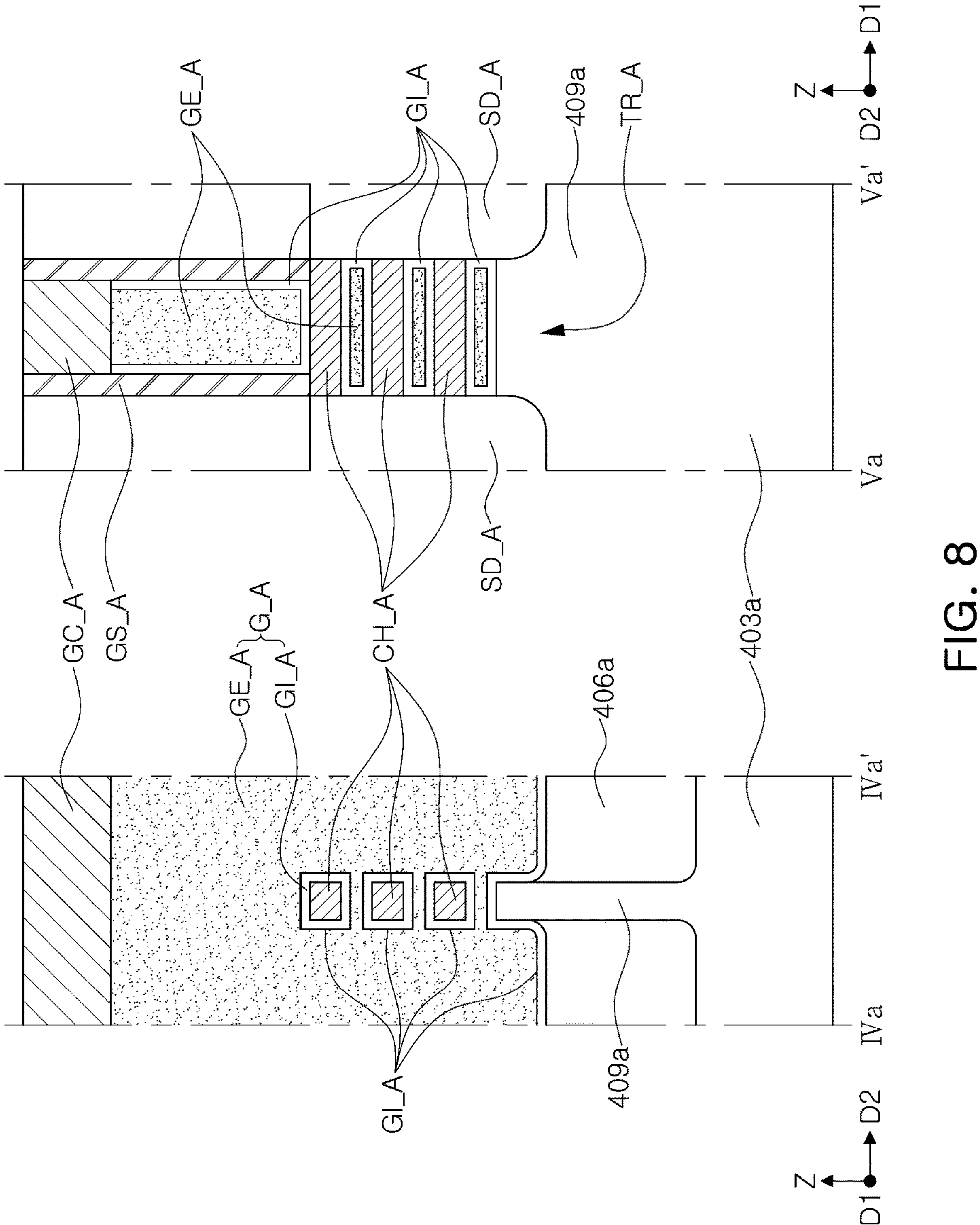
Figure 9:
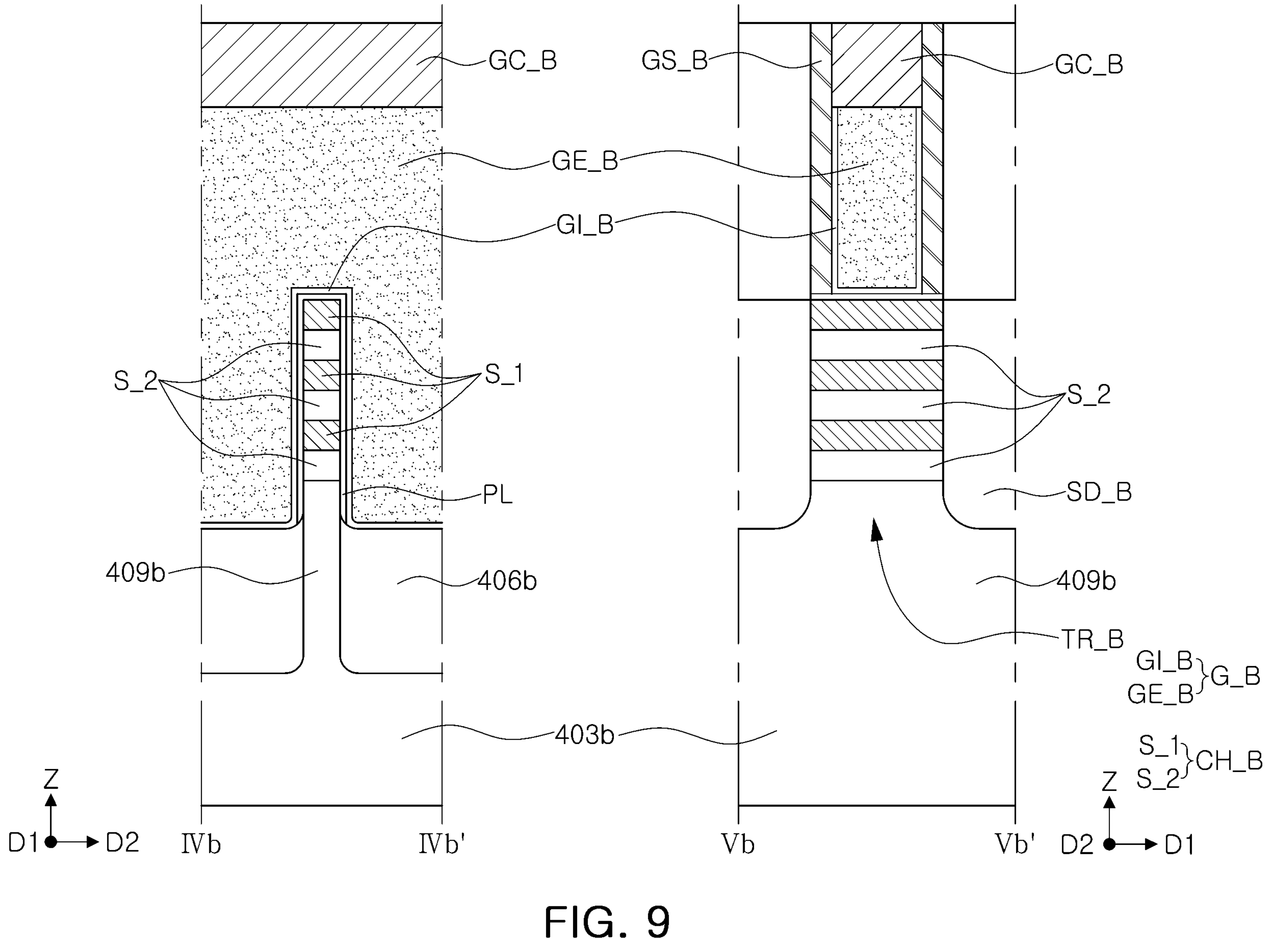

In an example, the plurality of transistors TR1, TR2, TR3, and TR4 may be comprised of the first three-dimensional transistor (TR_A in FIGS. 7-9) and the second three-dimensional transistor (TR_B in FIGS. 7-9), and the plurality of lower transistors TR_L1 and TR_L2 may be comprised of the first three-dimensional transistor (TR_A in FIGS. 7-9) and the second three-dimensional transistor (TR_B in FIGS. 7-9).

In another example, the plurality of transistors TR1, TR2, TR3, and TR4 may be configured as the first 3D transistor (TR_A of FIGS. 7-9).

In an example, among the plurality of transistors TR1, TR2, TR3, and TR4, transistors that may be the first and second driving transistors DX1 and DX2 may be configured as the first 3D transistor (TR_A in FIGS. 7-9), and transistors that may be the reset transistor RX and the selection transistor SX may be configured as the second 3D transistor (TR_B of FIGS. 7-9).

Hereinafter, with reference to FIGS. 7, 8 and 9, examples of the first 3D transistor (TR_A in FIGS. 7-9) including the first channel structure, and the second 3D transistor (TR_B in FIGS. 7-9) having the second channel structure will be described. FIG. 7 is a top plan view schematically illustrating examples of the first 3D transistor (TR_A in FIGS. 7-9) including the first channel structure and the second 3D transistor (TR_B in FIGS. 7-9) including the second channel structure. FIG. 8 is a cross-sectional view schematically illustrating regions taken along line IVa-IVa' and line Va-Va' of FIG. 7. FIG. 9 is a cross-sectional view schematically illustrating regions taken along line IVb-IVb' and line Vb-Vb' of FIG. 7.

First, referring to FIGS. 7 and 8, a first active fin **409*a* defined by a device isolation region 406*a* on a semiconductor substrate 403*a*, and extending in the first direction D1, may be disposed. The first 3D transistor TR_A may include first source/drains SD_A spaced apart from each other on the first active fin 409*a*, a plurality of channel layers CH_A stacked while being spaced apart from each other in the vertical direction Z on the first active fin 409*a* and disposed between the first sources/drains SD_A, and a first gate G_A traversing the active fin 409*a* in a second direction D2 perpendicular to the first direction D1, on the active fin 409*a***, and surrounding each of the plurality of channel layers CH_A.

The plurality of channel layers CH_A may be formed of a semiconductor material such as silicon.

The first gate G_A may include a first gate dielectric GI_A and a first gate electrode GE_A disposed on the first gate dielectric GI_A.

The first gate dielectric GI_A may include portions in contact with the plurality of channel layers CH_A, and the first active fin **409*a***.

The first gate electrode GE_A may fill between the plurality of channel layers CH_A together with the first gate dielectric GI_A and fill between lowermost one of the plurality of channel layers CH_A and the first active fin **409*a***.

The first gate dielectric GI_A may cover a lower surface and a side surface of the first gate electrode GE_A, on a level higher than an uppermost channel layer among the plurality of channel layers CH_A.

The first three-dimensional transistor TR_A may be a multi-bridge channel FET (MBCFET™) transistor that is a gate-all-around type field effect transistor.

An insulating gate capping layer GC_A may be disposed on the first gate G_A, and insulating gate spacers GS_A may be disposed on both side surfaces of the first gate G_A and the insulating gate capping layer GC_A.

Dummy structures D_A adjacent to the first source/drains SD_A may be disposed on both sides of the first gate G_A. The first 3D transistor TR_A may be disposed between the dummy structures D_A. The dummy structures D_A may be disposed in various shapes, such as a dummy gate or a dummy isolation structure.

Next, referring to FIGS. 7 and 9, a second active fin **409*b* defined by a device isolation region 406*b* and extending in the first direction D1 may be disposed on a semiconductor substrate 403*b*. The second 3D transistor TR_B may include second source/drains SD_B spaced apart from each other on the second active fin 409*b*, and may include a channel structure CH_B disposed between the second sources/drains SD_B and comprising first semiconductor layers S_1 and second semiconductor layers S_2 alternately and repeatedly stacked on the second active fin 409*b* in the vertical direction Z, and a second gate G_B traversing the second active fin 409*b* in the second direction D2 on the second active fin 409*b*** and covering an upper surface and a side surface of the channel structure CH_B.

In the channel structure CH_B, the first semiconductor layers S_1 may be formed of a first material, and the second semiconductor layers S_2 may be formed of a second material different from the first material. For example, the first semiconductor layers S_1 may be silicon layers, and the second semiconductor layers S_2 may be silicon-germanium layers.

The second gate G_B may include a second gate dielectric GI_B and a second gate electrode GE_B on the second gate dielectric GI_B.

The second 3D transistor TR_B may further include a buffer layer PL between the second gate G_B and the channel structure CH_B. The buffer layer PL may be formed of a semiconductor layer epitaxially grown from the channel structure CH_B.

An insulating gate capping layer GC_B may be disposed on the second gate G_B, and insulating gate spacers GS_B may be disposed on both sides of the second gate G_B and the insulating gate capping layer GC_B.

Dummy structures D_B adjacent to the second source/drains SD_B may be disposed on both sides of the second gate G_B. The second 3D transistor TR_B may be disposed between the dummy structures D_B. The dummy structures D_B may be disposed in various shapes, in the form such as a dummy gate or a dummy isolation structure.

According to the above-described embodiments, by classifying and disposing or distributing elements constituting the pixel circuit of the image sensor 1 in the upper chip CH_U and the first lower chip CH_L1 bonded vertically, the size of each of the pixels PX included in the pixel array 10 may be reduced, and relatively more pixels PX may be disposed in the pixel array 10 having the same area. Accordingly, the image sensor 1 capable of generating a high-resolution image may be provided.

Also, some transistors among elements constituting the pixel circuit may be formed of a high-performance transistor having a gate all-around gate structure, for example, the first 3D transistor TR_A.

In addition, by configuring the transistors constituting the logic circuit 20 with the first three-dimensional transistor TR_A and the second three-dimensional transistor TR_B, the performance of the image sensor 1 may be improved.

In addition, by bonding the upper chip CH_U, the first lower chip CH_L1, and the second lower chip CH_L2 using an intermetallic bonding, the vertical thickness may be significantly reduced and the signal transmission path may be significantly reduced. Accordingly, the performance of the image sensor 1 may be improved.

Figure 11:
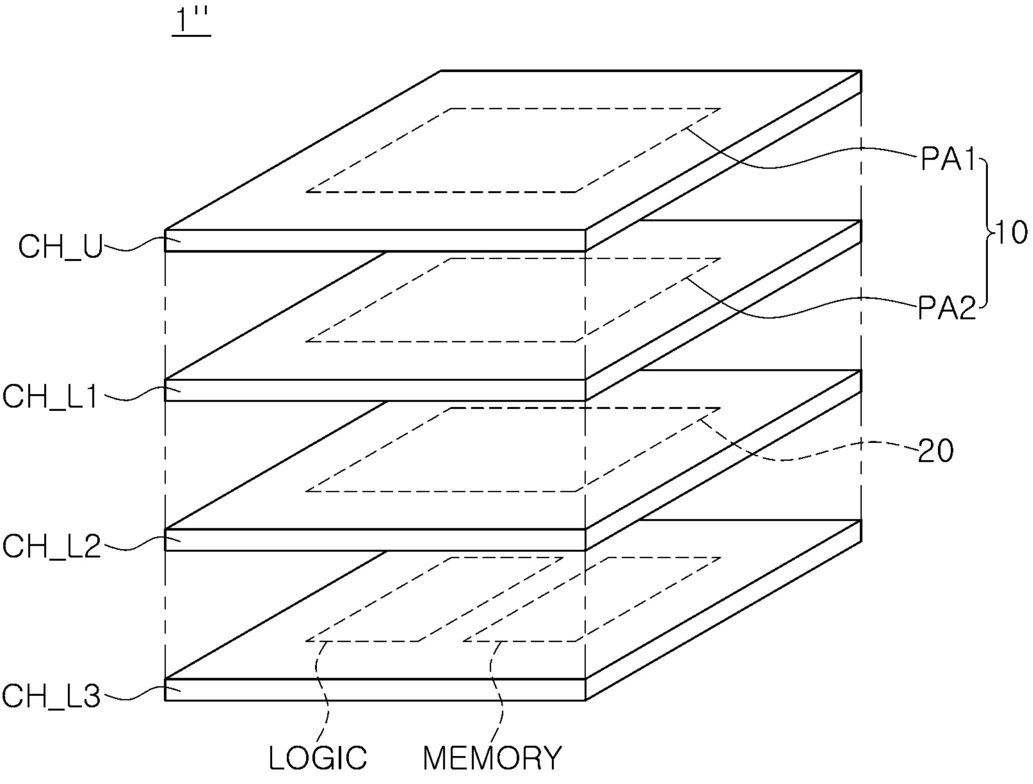
FIG. 11 is a perspective view schematically illustrating a modified example of an image sensor according to an example embodiment.

Hereinafter, various modifications of the image sensor 1 will be described. Various modified examples of the image sensor 1 to be described below will be mainly described with respect to a modified component or a replaced component. First, modified examples of the image sensor 1 will be described with reference to FIGS. 10 and 11, respectively. FIG. 10 is a schematic perspective view illustrating a modified example of the image sensor according to an example embodiment, and FIG. 11 is a schematic perspective view illustrating another modified example of the image sensor according to an example embodiment.

In a modified example, referring to FIG. 10, an image sensor 1' may include a lower chip CH_L' and an upper chip CH_U' that are sequentially stacked and bonded. The upper chip CH_U' may include the pixel array 10 described with reference to FIG. 1, and the lower chip CH_L' may include the logic circuit 20 described with reference to FIG. 1. The upper chip CH_U' may include elements of the respective pixels (PX of FIG. 1) constituting the pixel array 10. For example, the upper chip CH_U' may include the reset transistor RX, the driving transistors DX1 and DX2, and the selection transistor SX described with reference to FIG. 3B, together with all the components of the upper chip (CH_U of FIG. 6) described with reference to FIG. 6.

In an example, the reset transistor RX, the driving transistors DX1 and DX2 and the selection transistor SX may be configured as the first 3D transistor (TR_A in FIGS. 7-9) described with reference to FIGS. 7 to 9.

In another example, the reset transistor RX, the driving transistors DX1 and DX2 and the selection transistor SX may be configured as the first 3D transistor (TR_A of FIGS. 7-9) and the second 3D transistor (TR_B in FIGS. 7-9) described with reference to FIGS. 7 to 9. For example, the driving transistors DX1 and DX2 may be configured as the first 3D transistor (TR_A of FIGS. 7-9) described with reference to FIGS. 7 to 9, and the reset transistor RX and the selection transistor SX may be configured as the second 3D transistor (TR_B of FIGS. 7-9) described with reference to FIGS. 7 to 9.

In a modified example, referring to FIG. 11, an image sensor 1" may include the upper chip CH_U, the first lower chip CH_L1, and the second lower chip CH_L2 as in FIG. 3. The image sensor 1" may further include a third lower chip CH_L3 disposed below the second lower chip CH_L2. The third lower chip CH_L3 may include a logic circuit LOGIC and a memory. In the third lower chip CH_L3, the logic circuit LOGIC may include a circuit for artificial intelligence (AI). In the third lower chip CHL3, the memory may include a volatile memory capable of storing information and/or a non-volatile memory capable of storing information.

In the third lower chip CH_L3, transistors used in the logic circuit LOGIC and the memory may be configured using at least one of the first three-dimensional transistor (TR_A in FIGS. 7-9) and the second 3D transistors (TR_B in FIGS. 7-9).

Figure 12:
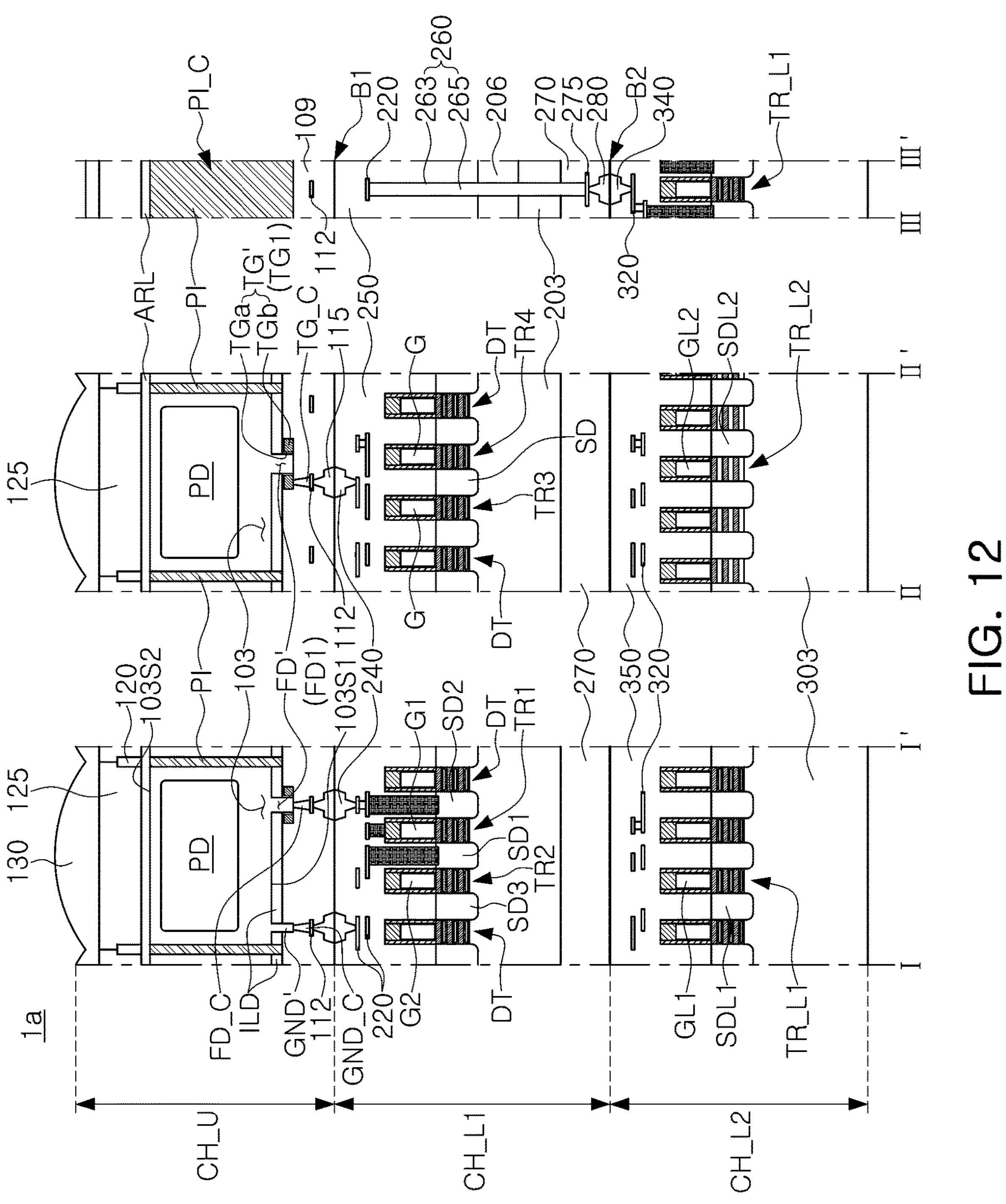
FIG. 12 is a cross-sectional view schematically illustrating a modified example of an image sensor according to an example embodiment.

Referring to FIG. 12, a modified example of the image sensor 1 will be described. FIG. 12 is a cross-sectional view schematically illustrating regions that may respectively correspond to regions taken along lines I-I', II-II', and III-III' of FIG. 5.

Referring to FIG. 12, an image sensor **1*a* may include a ground region GND', a floating diffusion region FD' and a transfer gate TG' which are modified from the ground region GND, the floating diffusion region FD, and the transfer gate TG described with reference to FIGS. 5 and 6**, respectively.

The image sensor **1*a* may include an insulating layer ILD disposed below the first surface 103S1 of the upper semiconductor substrate 103**.

The ground region GND' may have a pillar shape protruding from the first surface 103S1 of the upper semiconductor substrate 103 toward the first lower chip CH_L1. The pillar-shaped ground region GND' may penetrate through the insulating layer ILD.

At least a portion of the floating diffusion region FD' may have a pillar shape that protrudes from the first surface 103S1 of the upper semiconductor substrate 103 toward the first lower chip CH_L1. At least a portion of the floating diffusion region FD' having a pillar shape may penetrate through the insulating layer ILD.

The transfer gate TG' may cover the pillar-shaped floating diffusion region FD', for example, a side surface of the pillar portion, below the insulating layer ILD. The transfer gate TG' may include a transfer gate electrode TGb and a gate dielectric TGa between the transfer gate electrode TGb and the floating diffusion region FD'.

Figure 13:
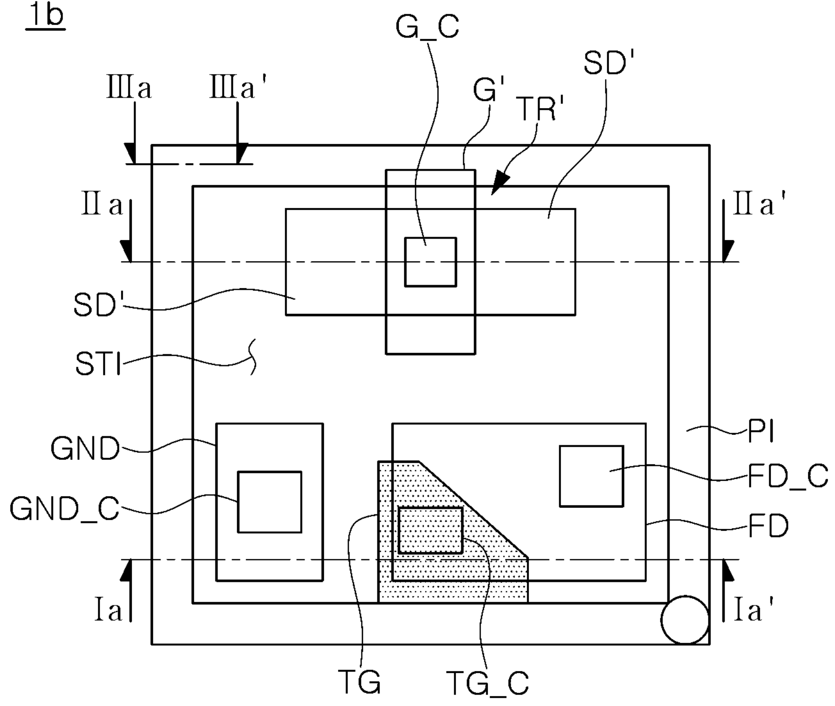
FIGS. 13 and 14 are diagrams schematically illustrating a modified example of an image sensor according to an example embodiment.
Figure 14:
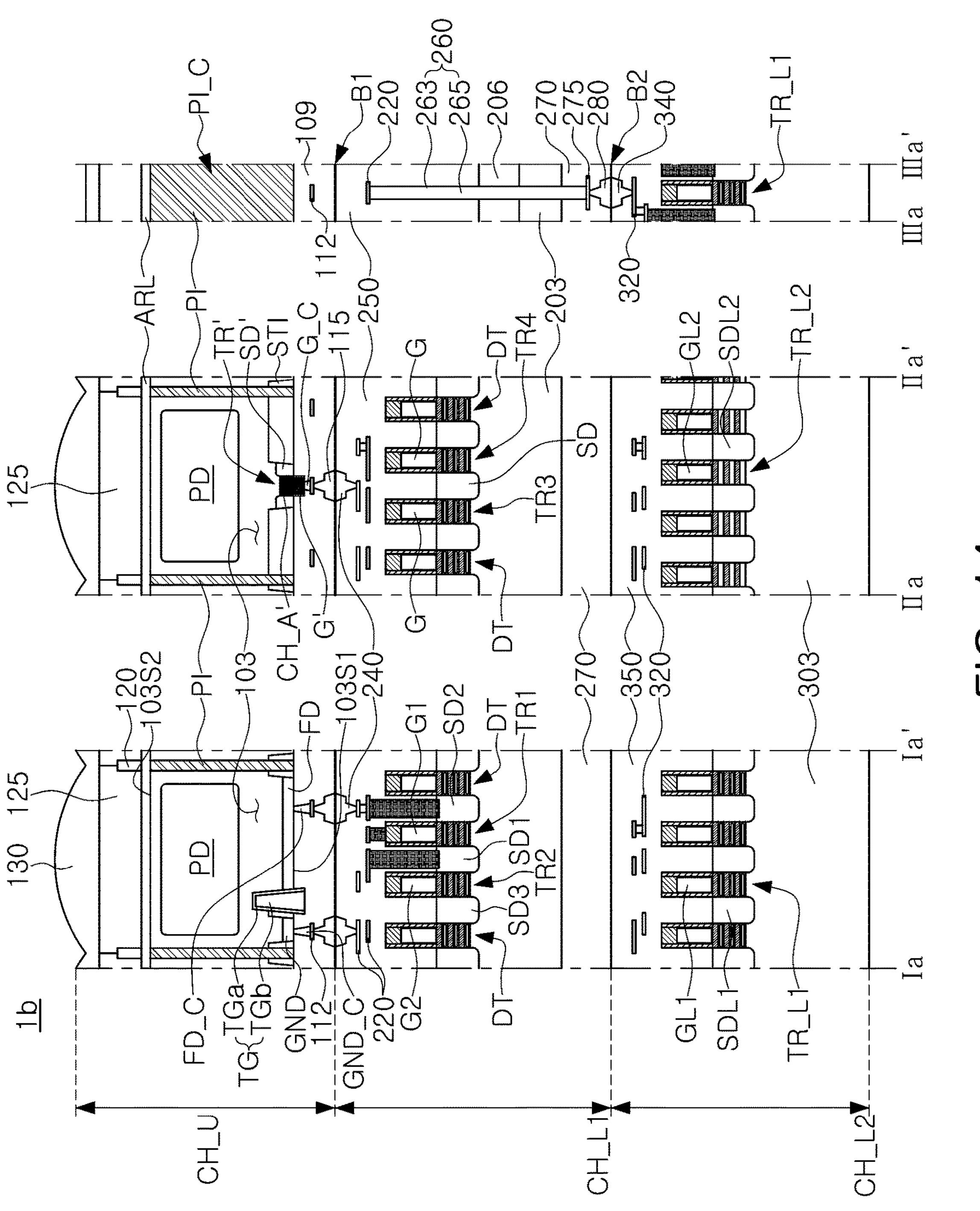

Referring to FIGS. 13 and 14, a modified example of the image sensor 1 will be described. FIG. 13 is a top view schematically illustrating one pixel in a modified example of the image sensor, and FIG. 14 is a cross-sectional view schematically illustrating regions that may respectively correspond to regions taken along lines Ia-Ia', IIa-IIa', and IIIa-IIIa' of FIG. 13.

Referring to FIGS. 13 and 14, in the image sensor 1 including the upper chip CH_U, the first lower chip CH_L1 and the second lower chip CH_L2 as in FIG. 2, the upper chip CH_U may include at least one upper transistor TR'. Accordingly, an image sensor **1*b*** including the upper chip CH_U including the at least one upper transistor TR' may be provided.

In the upper chip CH_U, the at least one upper transistor TR' may include at least one of the reset transistor RX, the selection transistor SX, and the driving transistor DX described with reference to FIG. 3A, or may include at least one of the reset transistor RX, the first and second driving transistors DX1 and DX2 and the selection transistor SX described in FIG. 3B. The at least one upper transistor TR' may include an upper gate G' and the source/drain SD'. The upper gate G' may be electrically connected to the upper interconnection structure 112 by an upper gate contact G_C.

The at least one upper transistor TR' may be configured as one of the first 3D transistor (TR_A in FIGS. 7-9) and the second 3D transistor (TR_B in FIGS. 7-9) described with reference to FIGS. 7 to 9, for example, configured as the first 3D transistor (TR_A of FIGS. 7-9) including the plurality of channel layers (CH_A of FIG. 8). Accordingly, the at least one upper transistor TR' may include a plurality of channel layers CH_A' substantially identical to the plurality of channel layers CH_A of FIG. 8.

In an example, the ground region GND and the floating diffusion region FD may be formed in substantially the same structure as the channel structure CH_B including the first semiconductor layers S_1 and the second semiconductor layers S_2 described with reference to FIG. 9. For example, the ground region GND and the floating diffusion region FD may include first semiconductor layers and second semiconductor layers that are alternately and repeatedly stacked. In this case, the first semiconductor layers may be formed of a first material, and the second semiconductor layers may be formed of a second material different from the first material. For example, the first semiconductor layers may be silicon layers, and the second semiconductor layers may be silicon-germanium layers.

Figure 15:
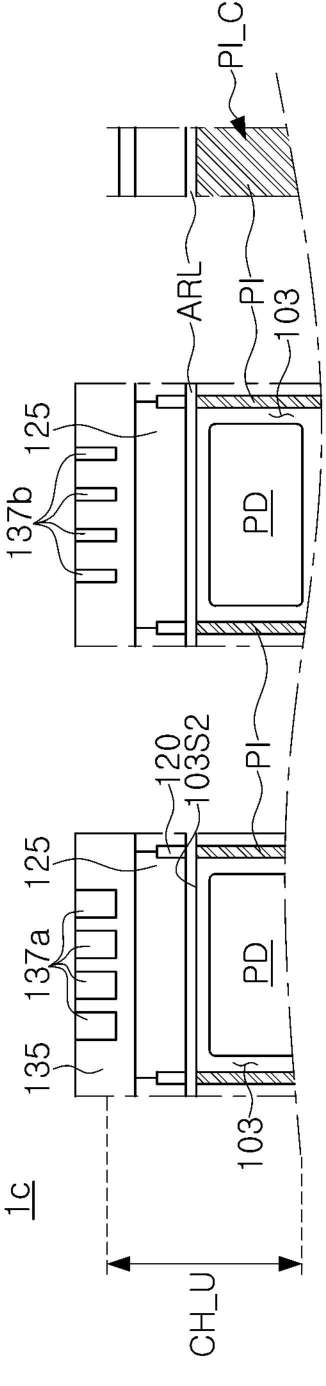
FIG. 15 is a cross-sectional view schematically illustrating a modified example of an image sensor according to an example embodiment.

Referring to FIG. 15, a modified example of the image sensor 1 will be described. FIG. 15 is a cross-sectional view schematically illustrating a portion of the upper chip CH_U in the image sensor 1 described above.

Referring to FIG. 15, an image sensor 1*c* may include the insulating structure ARL, the grid structure 120 and the color filters 125 as described above.

The image sensor 1*c* may further include a prism structure disposed on the grid structure 120 and the color filters 125. The prism structure may include an interface material 135 and meta patterns 137*a* and 137*b* buried in the interface material 135. The prism structures 135, 137*a*, and 137*b* may be planar lenses. The prism structures 135, 137*a*, and 137*b* as described above may replace the microlens (130 of FIG. 6) described with reference to FIG. 6.

Figure 16:
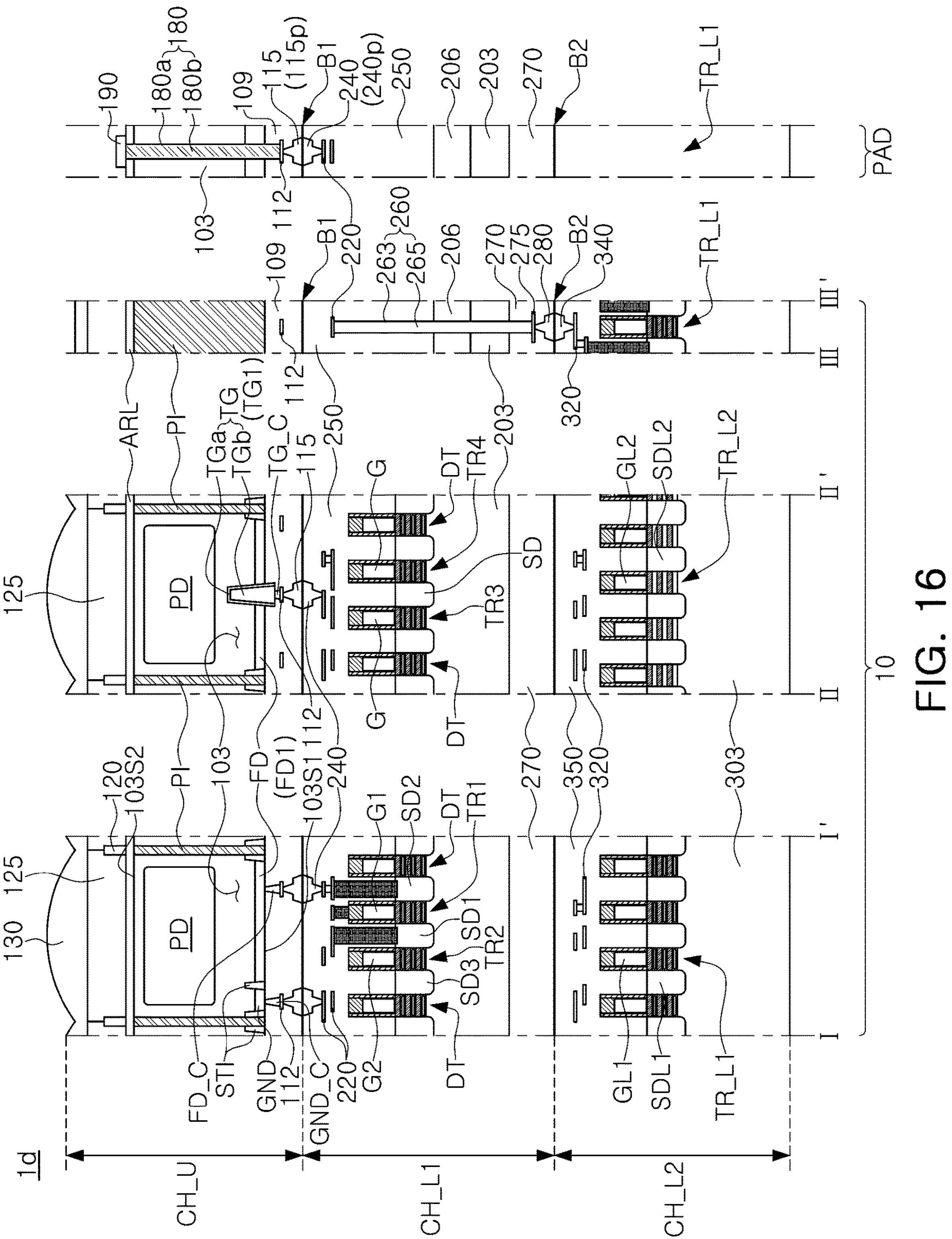
FIG. 16 is a cross-sectional view schematically illustrating a modified example of an image sensor according to an example embodiment.

Referring to FIG. 16, a modified example of the image sensor 1 will be described. FIG. 16 is a cross-sectional view further including a cross-sectional structure of the pad area (PAD of FIG. 2) in the image sensor 1 described above.

Referring to FIG. 16, an image sensor 1*d* may further include an upper through-electrode structure 180 disposed in the pad area PAD of the upper chip CH_U, and a pad pattern 190 on the upper through-electrode structure 180. The upper through-electrode structure 180 may penetrate through the insulating structure ARL and the upper semiconductor substrate 103 and may contact the upper interconnection structure 112. The upper through-electrode structure 180 may include a through electrode 180*b* and an insulating spacer 180*a* covering a side surface of the through electrode 180*b*.

The pad pattern 190 may be electrically connected to the logic circuit 20 of the second lower chip CH_L2 through the upper through-electrode structure 180, the upper interconnection structure 112, the upper bonding pad 115, the first lower bonding pad 240, the first lower interconnection structure 220, the through-electrode structure 260, the lower redistribution 275, the second and third lower bonding pads 280 and 340, and the second lower interconnection structure 320.

Figure 17:
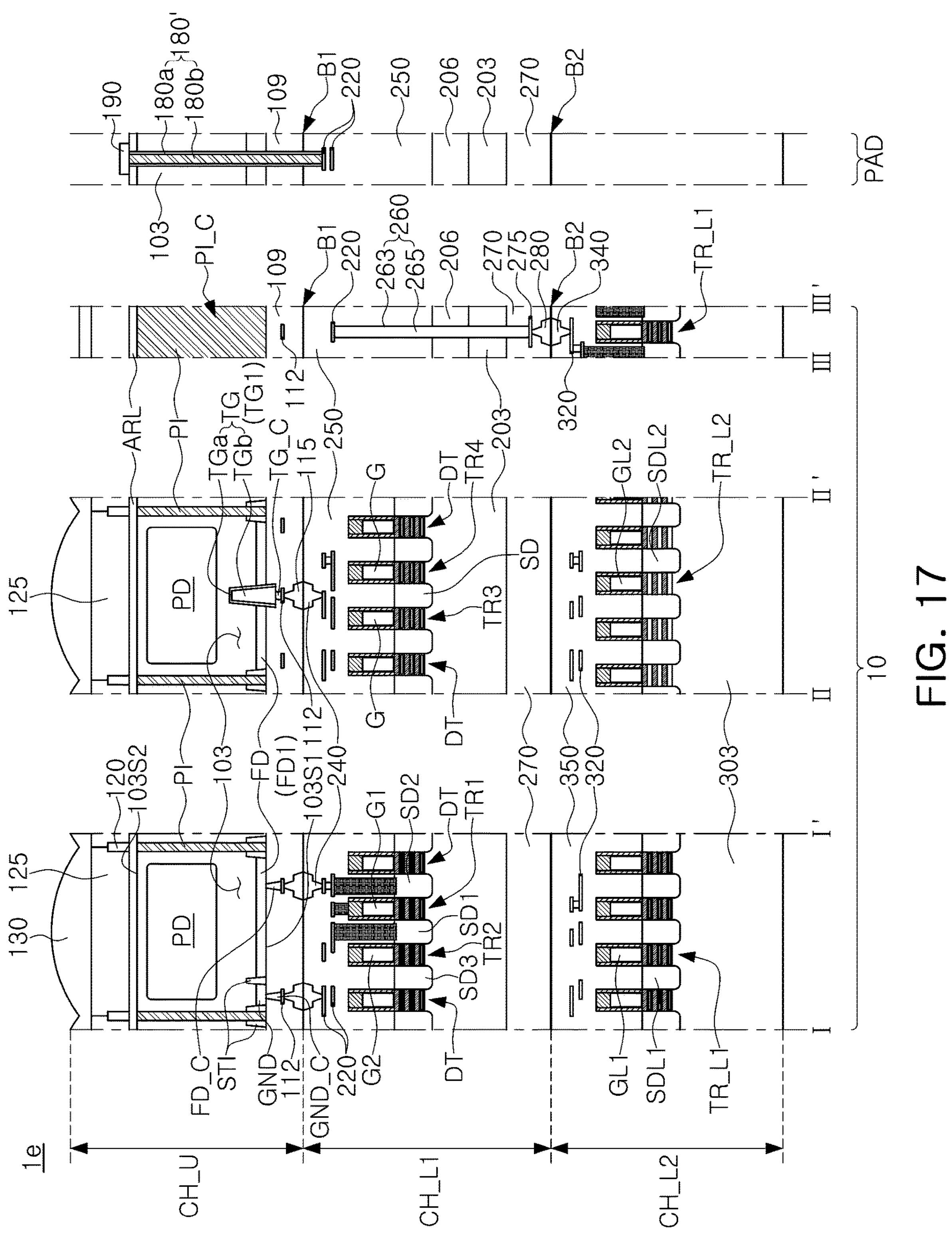
FIG. 17 is a cross-sectional view schematically illustrating a modified example of an image sensor according to an example embodiment.

Referring to FIG. 17, a modified example of the image sensor 1 will be described. FIG. 17 is a cross-sectional view further including a cross-sectional structure of the pad area (PAD of FIG. 2) in the image sensor 1 described above.

Referring to FIG. 17, an image sensor 1*e* may further include an upper through-electrode structure 180' passing through the pad area PAD of the upper chip CH_U and in contact with the first lower interconnection structure 220 of the first lower chip CH_L1, and a pad pattern 190 on the upper through-electrode structure 180. The upper through-electrode structure 180' may include a through-electrode 180*b* and an insulating spacer 180*a* covering a side surface of the through-electrode 180*b*.

The pad pattern 190 may be electrically connected to the logic circuit 20 of the second lower chip CH_L2 through the upper through-electrode structure 180, the first lower interconnection structure 220, the through-electrode structure 260, the lower redistribution 275, the second and third lower bonding pads 280 and 340, and the second lower interconnection structure 320.

As set forth above, according to example embodiments, an image sensor including an upper chip and a lower chip vertically bonded may be provided. By disposing or distributing the elements constituting the pixel circuit of the image sensor in or among the upper chip and the lower chip, the size of each pixel included in the pixel array area may be reduced, and relatively more pixels may be disposed in the pixel array of the same area. Accordingly, an image sensor capable of generating a high-resolution image may be provided.

Also, some transistors among elements constituting the pixel circuit may be formed as high-performance transistors having a gate all-around gate structure.

While example embodiments have been illustrated and described above, it will be apparent to those skilled in the art that modifications and variations could be made without departing from the scope of the present inventive concept as defined by the appended claims.

What is claimed is:

1. An image sensor comprising:
a first lower chip; and
an upper chip on and bonded to the first lower chip,
wherein the first lower chip and the upper chip collectively comprise a plurality of pixels,
wherein a respective pixel of the plurality of pixels comprises:
a photoelectric conversion element, a floating diffusion region, a ground region, and a transfer gate in the upper chip; and
a plurality of lower transistors in the first lower chip, and
wherein a first lower transistor among the plurality of lower transistors comprises a plurality of first channel layers stacked vertically, and a first gate on the plurality of first channel layers,
wherein the upper chip further comprises:
a semiconductor substrate having a first surface and a second surface opposing each other;
an insulating structure on the second surface of the semiconductor substrate;
pixel isolation structures in the semiconductor substrate; and
color filters on the insulating structure,
wherein the photoelectric conversion element is in the semiconductor substrate, between the pixel isolation structures, and
the floating diffusion region and the ground region are in the semiconductor substrate adjacent to the first surface.

2. The image sensor of claim 1, wherein the first lower transistor comprises a source/drain electrically connected to the floating diffusion region and vertically overlapping the floating diffusion region.

3. The image sensor of claim 1, wherein a second lower transistor among the plurality of lower transistors has a channel structure comprising first semiconductor layers and second semiconductor layers that are alternately stacked, and a second gate on side surfaces and an upper surface of the channel structure, and wherein a first material of the first semiconductor layers and a second material of the second semiconductor layers are different from each other.

4. The image sensor of claim 1, wherein the upper chip comprises an upper interconnection structure and upper bonding pads electrically connected to the upper interconnection structure, and the first lower chip comprises a lower interconnection structure and lower bonding pads electrically connected to the lower interconnection structure, wherein the lower bonding pads are bonded to the upper bonding pads, and among the lower bonding pads and the upper bonding pads, any one lower bonding pad and any one upper bonding pad bonded to each other vertically overlap the floating diffusion region.

5. The image sensor of claim 4, wherein the upper chip further comprises:

a ground contact electrically connected to the ground region;

a floating diffusion contact electrically connected to the floating diffusion region; and a transfer gate contact electrically connected to a transfer gate electrode of the transfer gate, wherein the ground contact, the floating diffusion contact, and the transfer gate contact are electrically connected to the upper bonding pads by the upper interconnection structure.

6. The image sensor of claim 1, wherein the upper chip further comprises a device isolation layer between the ground region and the floating diffusion region, and at least a portion of the transfer gate is in a region recessed in a direction from the first surface of the semiconductor substrate toward the second surface of the semiconductor substrate.

7. The image sensor of claim 1, wherein the floating diffusion region comprises a pillar portion, and the transfer gate is on at least a portion of a side surface of the pillar portion of the floating diffusion region.

8. The image sensor of claim 1, further comprising an upper transistor in the upper chip, wherein the upper transistor comprises a plurality of upper channel layers vertically stacked, and an upper gate structure on the plurality of upper channel layers.

9. The image sensor of claim 8, wherein the floating diffusion region comprises first semiconductor layers and second semiconductor layers that are alternately stacked, wherein a first material of the first semiconductor layers and a second material of the second semiconductor layers are different from each other.

10. The image sensor of claim 1, wherein the first lower transistor comprises a reset transistor, a selection transistor, or a driving transistor of the respective pixel, and the image sensor further comprising:

a second lower chip below the first lower chip, wherein the second lower chip comprises a circuit configured to control a pixel array comprising the plurality of pixels.

11. The image sensor of claim 10, wherein the upper chip is free of the reset transistor, the selection transistor, and/or the driving transistor of the respective pixel, wherein the circuit of the second lower chip comprises transistors having at least one of a first three-dimensional (3D) transistor structure or a second three-dimensional (3D) transistor structure, wherein the first 3D transistor structure comprises a plurality of lower channel layers vertically stacked, and a first lower gate on the plurality of lower channel layers, and wherein the second 3D transistor structure has a lower channel structure comprising first lower semiconductor layers and second lower semiconductor layers that are alternately stacked, and a second lower gate on side surfaces and an upper surface of the lower channel structure.

12. An image sensor comprising:

a first lower chip;

an upper chip on and bonded to the first lower chip; and a second lower chip bonded to the first lower chip, below the first lower chip, wherein the first lower chip and the upper chip collectively comprise a pixel array having a plurality of pixels, wherein the second lower chip comprises a control circuit configured to control the pixel array, wherein a respective pixel of the plurality of pixels comprises a photoelectric conversion element, a floating diffusion region, a ground region, a transfer gate, a reset transistor, a selection transistor, and a driving transistor, wherein the upper chip comprises the photoelectric conversion element, the floating diffusion region, the ground region, and the transfer gate, wherein the first lower chip comprises at least one transistor among the reset transistor, the selection transistor, or the driving transistor, wherein the at least one transistor of the first lower chip has a first three-dimensional transistor structure comprising a plurality of first channel layers stacked vertically, and a first gate on the plurality of first channel layers, wherein the upper chip comprises an upper bonding pad and the first lower chip comprises a lower bonding pad bonded to the upper bonding pad, wherein the at least one transistor comprises a source/drain electrically connected to the floating diffusion region, and wherein at least one of the upper bonding pad, the lower bonding pad, or the source/drain vertically overlaps the floating diffusion region.

13. The image sensor of claim 12, wherein the at least one transistor is the driving transistor.

14. The image sensor of claim 12, wherein in the first lower chip, the reset transistor, the selection transistor, and the driving transistor comprise the first three-dimensional transistor structure and a second three-dimensional transistor structure different from the first three-dimensional transistor structure, wherein the second three-dimensional transistor structure has a channel structure comprising first semiconductor layers and second semiconductor layers that are alternately stacked, and a second gate on side surfaces and an upper surface of the channel structure, and a first material of the first semiconductor layers and a second material of the second semiconductor layers are different from each other.

15. The image sensor of claim 14, wherein the upper chip is free of the reset transistor, the selection transistor, and/or the driving transistor of the respective pixel, and wherein the control circuit of the second lower chip comprises transistors of the first three-dimensional transistor structure and the second three-dimensional transistor structure.

16. An image sensor comprising:

a first lower chip;

an upper chip on and bonded to the first lower chip; and a second lower chip bonded to the first lower chip, below the first lower chip, wherein the first lower chip and the upper chip collectively comprise a pixel array having a plurality of pixels, wherein the second lower chip comprises a control circuit configured to control the pixel array, wherein a respective pixel of the plurality of pixels comprises a photoelectric conversion element, a floating diffusion region, a ground region, a transfer gate, a reset transistor, a selection transistor, and a driving transistor, wherein the upper chip comprises the photoelectric conversion element, the floating diffusion region, the ground region, and the transfer gate, wherein the first lower chip comprises at least a first transistor among the reset transistor, the selection transistor, or the driving transistor, wherein the upper chip further comprises:

an upper semiconductor substrate having a first surface and a second surface opposing each other;

color filters on the second surface of the upper semiconductor substrate;

pixel isolation structures in the upper semiconductor substrate;

an upper insulating structure below the first surface of the upper semiconductor substrate; and upper bonding pads in the upper insulating structure and having lower surfaces coplanar with a lower surface of the upper insulating structure, wherein the photoelectric conversion element is in the upper semiconductor substrate, between the pixel isolation structures, wherein the floating diffusion region and the ground region are in the upper semiconductor substrate adjacent to the first surface of the upper semiconductor substrate, wherein the first lower chip further comprises:

a first lower semiconductor substrate;

a first lower insulating structure on the first lower semiconductor substrate;

first lower bonding pads in the first lower insulating structure and having upper surfaces coplanar with an upper surface of the first lower insulating structure; and a lower protective insulating layer below the first lower semiconductor substrate, wherein the second lower chip further comprises:

a second lower semiconductor substrate; and a second lower insulating structure on the second lower semiconductor substrate, wherein the first lower bonding pads and the upper bonding pads are in contact with each other, and wherein the first transistor of the first lower chip has a first three-dimensional transistor structure comprising a plurality of first channel layers vertically stacked, and a first gate on the plurality of first channel layers, wherein a second transistor of the first lower chip has a channel structure comprising first semiconductor layers and second semiconductor layers that are alternately stacked, and a second gate on side surfaces and an upper surface of the channel structure, and wherein a first material of the first semiconductor layers and a second material of the second semiconductor layers are different from each other.

17. The image sensor of claim 16, wherein in the first lower chip, the reset transistor, the selection transistor, and the driving transistor comprise the first three-dimensional transistor structure and a second three-dimensional transistor structure of the second transistor, wherein the second three-dimensional transistor structure is different from the first three-dimensional transistor structure, and wherein the second three-dimensional transistor structure has the channel structure comprising the first semiconductor layers and the second semiconductor layers that are alternately stacked, and the second gate on the side surfaces and the upper surface of the channel structure.

18. The image sensor of claim 16, wherein the upper chip further comprises:

an upper interconnection structure in the upper insulating structure;

an upper through-electrode structure penetrating the upper semiconductor substrate and in contact with the upper interconnection structure; and a pad pattern on the upper through-electrode structure, wherein the first lower chip further comprises:

a first lower interconnection structure in the first lower insulating structure; and a lower through-electrode structure penetrating the first lower semiconductor substrate, wherein the pixel isolation structures comprise a first line portion extending in a first direction, a second line portion extending in a second direction intersecting the first direction, and an intersection region on which the first line portion and the second line portion intersect, and wherein the lower through-electrode structure vertically overlaps the intersection region.

19. The image sensor of claim 16, further comprising:

an upper through-electrode structure penetrating a pad area of the upper chip and extending into the first lower chip, wherein the first lower chip further comprises:

a first lower interconnection structure in the first lower insulating structure; and a lower through-electrode structure penetrating the first lower semiconductor substrate, wherein the pixel isolation structures comprise a first line portion extending in a first direction, a second line portion extending in a second direction intersecting the first direction, and an intersection region on which the first line portion and the second line portion intersect, wherein the lower through-electrode structure vertically overlaps the intersection region, and wherein the upper through-electrode structure is electrically connected to the first lower interconnection structure.

20. The image sensor of claim 16, wherein at least one of the first transistor of the first lower chip or the second transistor of the first lower chip comprises a source/drain electrically connected to the floating diffusion region and vertically overlapping the floating diffusion region.

* * * * *